United States Patent

Tanaka

[11] Patent Number: 6,125,052
[45] Date of Patent: Sep. 26, 2000

[54] SEMICONDUCTOR MEMORY DEVICE

[75] Inventor: Tomoharu Tanaka, Yokohama, Japan

[73] Assignee: Kabushiki Kaisha Toshiba, Kawasaki, Japan

[21] Appl. No.: 09/152,784

[22] Filed: Sep. 14, 1998

[30] Foreign Application Priority Data

Sep. 18, 1997 [JP] Japan .................................. 9-253816

[51] Int. Cl.[7] .................................................. G11C 16/04
[52] U.S. Cl. ............................. 365/185.03; 365/185.17; 365/185.23
[58] Field of Search ......................... 365/185.03, 185.17, 365/185.23

[56] References Cited

U.S. PATENT DOCUMENTS

| | | | |
|---|---|---|---|
| 5,295,096 | 3/1994 | Nakajima ................................. | 365/185 |
| 5,361,227 | 11/1994 | Tanaka et al. ...................... | 365/189.01 |
| 5,426,608 | 6/1995 | Higashitani ............................. | 365/200 |
| 5,596,526 | 1/1997 | Assar et al. ........................ | 365/185.17 |
| 5,617,353 | 4/1997 | Lim et al. ........................... | 365/185.17 |
| 5,696,717 | 12/1997 | Koh ..................................... | 365/185.22 |
| 5,729,491 | 3/1998 | Kim et al. ........................... | 365/185.11 |

*Primary Examiner*—Richard Elms
*Assistant Examiner*—Tuan T. Nguyen
*Attorney, Agent, or Firm*—Banner & Witcoff, Ltd.

[57] ABSTRACT

A word line controller selects a word line in a memory cell array and applies a voltage necessary for a read, write, or erase to the selected word line. The memory cell array, a bit line controller, a column decoder, a data I/O buffer, the word line controller, and a data detector are controlled by a control signal/control voltage generator. The control signal/control voltage generator includes a read/verify voltage generator. The voltage of the selected word line (WL) upon a read or write verify that is generated by the control signal/control voltage generator is adjusted in accordance with the common source line voltage of the memory cell array.

32 Claims, 24 Drawing Sheets

SEMICONDUCTOR MEMORY DEVICE

BACKGROUND OF THE INVENTION

The present invention relates to a semiconductor memory device and, more particularly, to a multi-valued flash memory, a multi-valued EEPROM, and a multi-valued EPROM.

As one of EEPROM memory cells, a memory cell having a MOSFET structure in which a charge storage layer (floating gate) and a control gate are stacked on a semiconductor substrate is known. In general, data "0" or "1" is stored in accordance with the charge amount stored in the floating gate, and 1-bit data is stored in one cell. To realize a high-density EEPROM, a multi-valued storage method of storing multibit data in one cell is known. For example, in a 4-valued storage method, to store data "0", "1", "2", and "3" in one cell, four charge amounts corresponding to these data are stored in the floating gate.

An example of the data storage state will be explained using the 4-valued method. The neutral state is the state wherein the charge amount of the floating gate is 0, and the erase state is the state wherein positive charges are stored in the neutral state. The erase state corresponds to data "0". For example, data is erased by applying a high voltage (up to 20V) to the substrate and setting the control gate at 0V. The data "1" state is the state wherein negative charges are stored in the neutral state. The data "2" state is also the state wherein negative charges are stored in the neutral state but the negative charge amount is larger than in the data "1" state. In the data "3" state, the negative charge amount is much larger. For example, during a write, the substrate and the source and drain are set at 0V, and the control gate is set at a high voltage (up to 20V) to store negative charges in the floating gate and write data "1", "2", and "3". During a write, the substrate is set at 0V, the source and drain are set at 10V, and the control gate is set to a high voltage (up to 20V) to maintain the charges in the floating gate and store data "0" in the memory cell. This operation realizes four write states ("0", "1", "2", and "3") in the memory cell.

The write state of the memory cell is checked by applying a predetermined read voltage to the control gate and detecting whether a current called a cell current flows through the channel of the memory cell. The four write states can be determined by preparing three read voltages. In the memory cell flowing the cell current, the cell current increases the source voltage because a parasitic resistance exists between the source and ground voltage.

As one of multi-valued EEPROMs, an EEPROM in which multibyte data are written at once as multi-valued data in the memory cell is known (Jpn. Pat. Appln. KOKAI Publication No. 7-93979). To shorten the write time, data are written at once, and thus this EEPROM comprises a plurality of data memory circuits for storing control data for writing multi-valued data in each memory cell. To control the write state with high precision, e.g., the write state of the memory cell is detected after a write (write verify). For an insufficiently written memory cell, the control data of the data memory circuit is converted to apply a write voltage for enhancing a write in only this memory. Using the converted control data, data is written again. A write and write verify are continuously performed until data are satisfactorily written in all selected memory cells. In a read, similar to a write, data are also read out at once in units of a plurality of bytes in order to shorten the read time. The source of each memory cell is connected to a common source line.

In this EEPROM, the cell current greatly increases the common source line voltage in a read or write verify. This voltage depends on the number of memory cells flowing the cell current and the data pattern of a memory cell subjected to a simultaneous read or write verify. For this reason, there is a problem that the memory cell state cannot be accurately detected.

For example, when a voltage of 1V or more is applied to the control gate of a memory cell whose threshold voltage is 1V, the cell current should flow. However, the cell current flowing through memory cells other than this memory cell makes the common source line voltage float, and no cell current may flow through the memory cell whose threshold voltage is 1V. Particularly in the multi-valued memory cell, floating of source line voltage is a serious problem because a read and write must be controlled with high accuracy.

In the conventional memory, therefore, the memory cell state cannot be detected with high accuracy due to an increase in source line voltage caused by the flowing cell current.

The present invention has been made in consideration of the above situation, and its object is to provide a semiconductor memory device capable of detecting the memory cell state with high precision.

BRIEF SUMMARY OF THE INVENTION

A semiconductor memory device according to the present invention comprises a memory cell having a gate, a drain, and a source, a controller for applying a read gate voltage to the gate in order to detect a state of the memory cell, and a control voltage generator for adjusting and generating the read gate voltage in accordance with a voltage of the source.

According to the present invention, when the read gate voltage is to be applied to the gate electrode of the memory cell in order to detect the state of the memory cell in which predetermined data is stored, the read gate voltage is adjusted and generated in accordance with the voltage of the source electrode.

More specifically, in the semiconductor memory device, the read voltage applied to the gate electrode (control gate) of the memory cell upon a read or write verify after a write is adjusted in accordance with the source voltage of the memory cell. Alternatively, the read voltage is adjusted in accordance with the voltage of the source line common to a plurality of memory cells.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

The present invention will be described in detail below with reference to the several views of the accompanying drawing.

Figure 1:
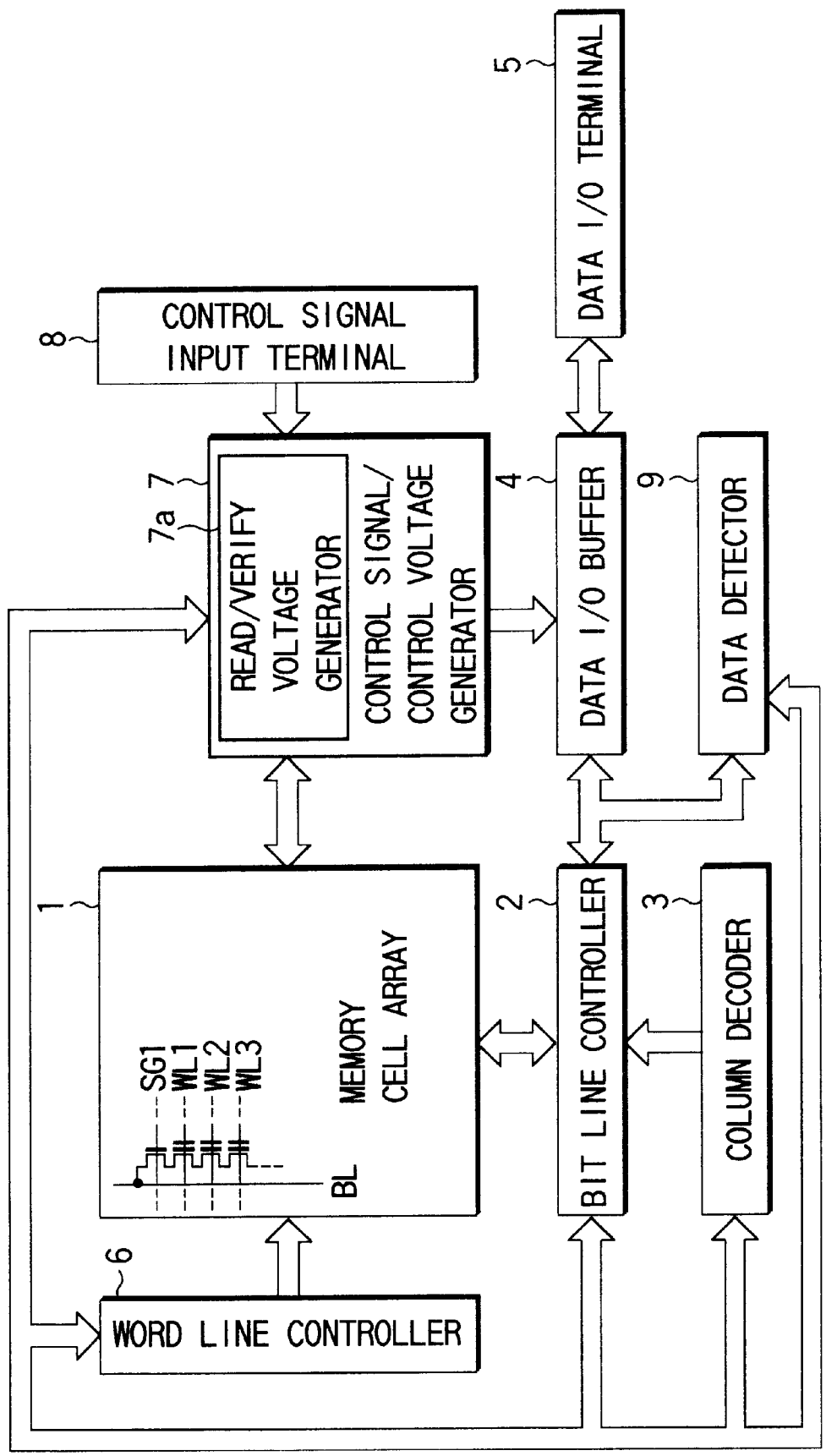
FIG. 1 is a block diagram showing the arrangement of a semiconductor memory device according to an embodiment of the present invention.

FIG. 1 is a block diagram showing the arrangement of a semiconductor memory device and, more particularly, a multi-valued storage NAND flash memory according to an embodiment of the present invention.

A memory cell array 1 comprises a plurality of bit lines, a plurality of word lines, and a common source line, and is constituted by arranging electrically erasable memory cells in a matrix. A bit line controller 2 for controlling the bit line and a word line controller 6 are arranged for the memory cell array 1.

The bit line controller 2 reads out data from the memory cell in the memory cell array 1 via the bit line, writes data in the memory cell by applying a write control voltage to the memory cell in the memory cell array 1 via the bit line, and detects the write state (electrical characteristics) of the memory cell in the memory cell array 1 via the bit line. The bit line controller 2 includes a plurality of data memory circuits (not shown). Memory cell data read out by a data memory circuit selected by a column decoder 3 is output from an I/O terminal 5 to the outside via a data I/O buffer 4. Write data externally input to the data I/O terminal 5 is input as initial control data via the data I/O buffer 4 to a data memory circuit selected by the column decoder 3. A data detector 9 is arranged to detect the contents stored in a plurality of data memory circuits of the bit line controller 2.

The word line controller 6 selects a word line in the memory cell array 1 and applies a voltage necessary to a read, write, or erase to the word line. The memory cell array 1, the bit line controller 2, the column decoder 3, the data I/O buffer 4, the word line controller 6, and the data detector 9 are controlled by a control signal/control voltage generator 7. The control signal/control voltage generator 7 is controlled by a control signal externally input to a control signal input terminal 8, and responds to the contents of a plurality of data memory circuits of the bit line controller 2 that are detected by the data detector 9.

The control signal/control voltage generator 7 shown in FIG. 1 comprises a read/verify voltage generator 7a according to the present invention. The read/verify voltage generator 7a adjusts, in accordance with the common source line voltage of the memory cell array 1, the read or write verify voltage of a selected word line WL that is generated by the control voltage generator 7. That is, the read/verify voltage generator 7a generates, e.g., 1V for a common source line voltage of 0V, and 1.2V for a common source line voltage of 0.2V.

More specifically, the cell current flowing in detecting the memory cell state increases the source line voltage, so it is difficult to control a read/write from/in a memory cell whose threshold voltage is about 1V, such as a multi-valued memory. To solve this problem, the voltage of the selected word line WL applied in a read or write verify is adjusted in accordance with the source line voltage, thereby keeping the voltage difference with the common source line almost constant. Accordingly, for example, the voltage difference between the source and gate of the memory cell is kept at 1V, and the memory cell state can be accurately detected.

The arrangement of each block in FIG. 1 will be described in detail.

Figure 2:
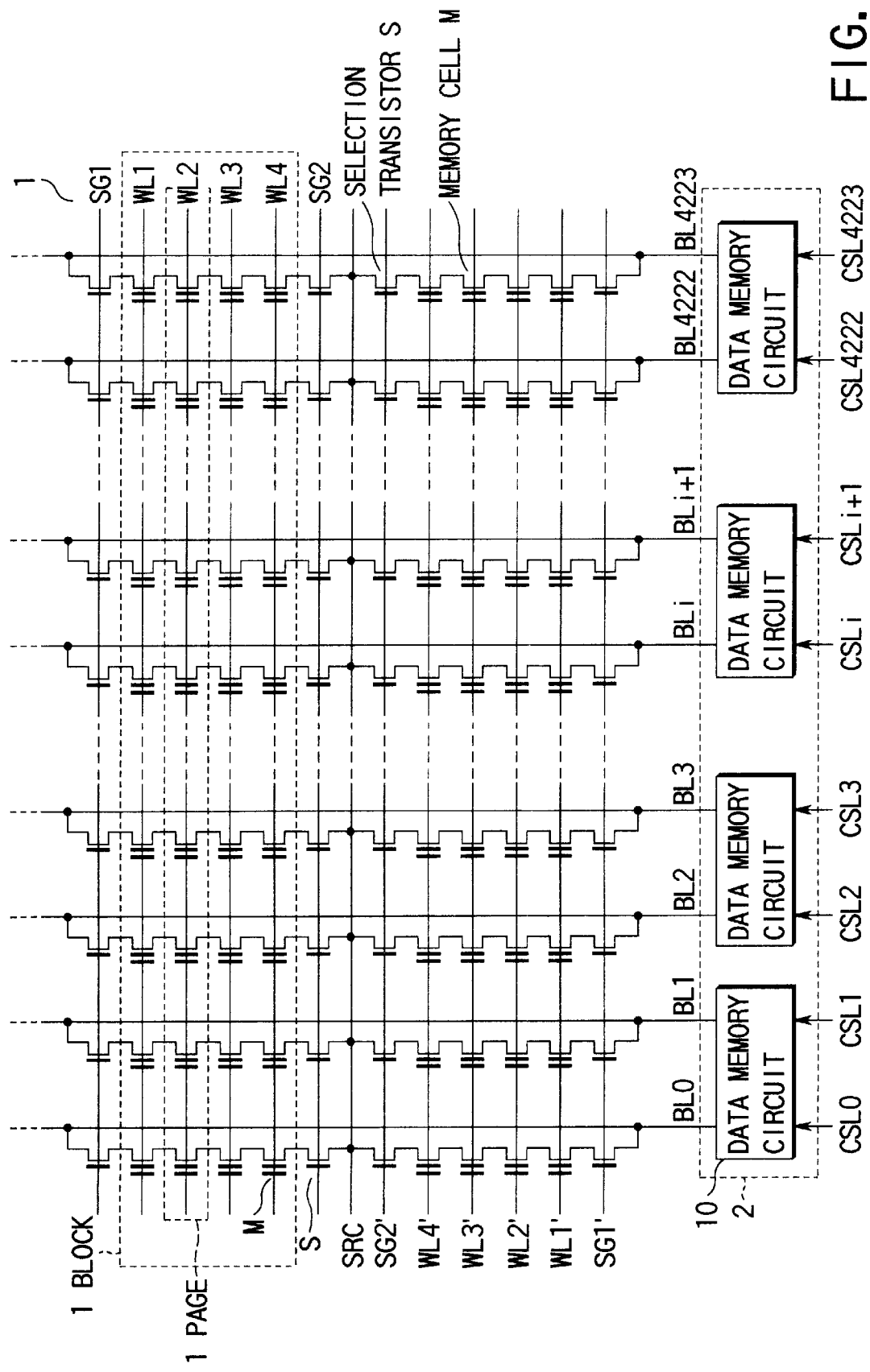
FIG. 2 is a circuit diagram showing the arrangement of a memory cell array and a bit line controller (data memory circuit) in FIG. 1.

FIG. 2 is a circuit diagram showing the arrangements of the memory cell array 1 and the bit line controller 2 (data memory circuit) in FIG. 1. One terminal of a NAND cell unit obtained by series-connecting four memory cells M is connected to a bit line BL via a selection transistor S, and the other terminal of the cell unit is connected to a common source line SRC via the selection transistor S. The control gate electrode of each memory cell M is connected to the word line WL, and two selection transistors S are respectively connected to selection gates SG1 and SG2. The memory cells M sharing one word line WL form a page, and four pages form one block. In FIG. 2, two blocks are shown, but the number of blocks may be any integer, e.g., 1,024 blocks. In FIG. 2, 4,224 bit lines BL0 to BL4223 are shown, but the number of bit lines BL may be any integer, e.g., 2,112.

The bit line controller 2 includes a plurality of data memory circuits 10, as described above. One data memory circuit 10 is arranged for two bit lines BL, but may be arranged for an arbitrary number of bit lines, e.g., one, four, six, or nine bit lines. A signal CSL is an output signal from the column decoder 3.

Memory cell data stored in the data memory circuit 10 connected to the bit lines BL0 and BL1 is output to the data I/O buffer 4 by, e.g., signals CSL0 and CSL1

Control data is initially transferred from the data I/O buffer 4 to the data memory circuit 10 connected to the bit lines BL2 and BL3 by, e.g., signals CSL2 and CSL3. In a read, the data memory circuit 10 reads out data of a memory cell connected to either one of the bit lines. In a write, the data memory circuit 10 applies a write control voltage to a memory cell connected to either one of the bit lines in accordance with the stored control data. In detecting the write state, the data memory circuit 10 selectively applies a read bit line signal to either one of the bit lines in accordance with the stored control data, and detects the write state of the connected memory cell.

Figures 3A, 3B:
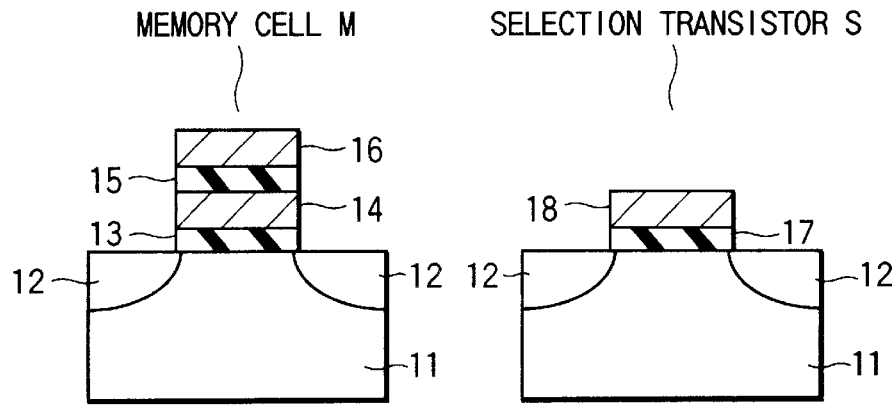
FIGS. 3A and 3B are sectional views, respectively, showing the structures of a memory cell and a selection transistor shown in FIG. 2.

FIGS. 3A and 3B are sectional views, respectively, showing the structures of the memory cell M and the selection transistor S shown in FIG. 2. In both FIGS. 3A and 3B, n-type diffusion layers 12 are formed in the surface of a p-type semiconductor substrate 11. One of the n-type diffusion layers 12 serves as a drain, and the other serves as a source. As shown in FIG. 3A, in the memory cell M, a floating gate 14 and a control gate 16 are formed on the semiconductor substrate 11 via insulating films 13 and 15, respectively. In the selection transistor S in FIG. 3B, a selection gate 18 serving as a selection gate SG is formed on the semiconductor substrate 11 via an insulating film 17.

Figure 4:
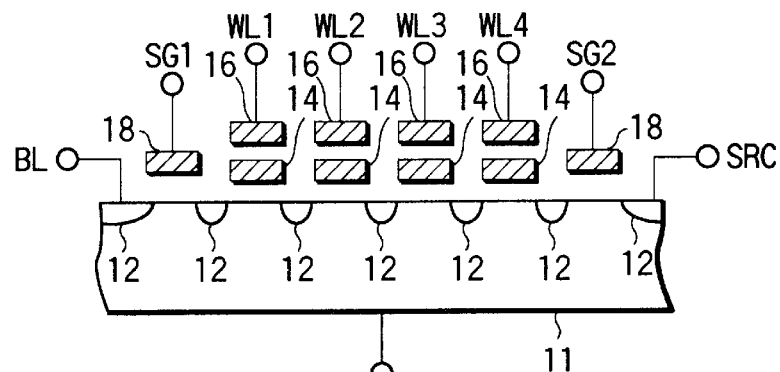
FIG. 4 is a sectional view showing the structure of one NAND cell unit in FIG. 2.

FIG. 4 is a sectional view showing the structure of one NAND cell unit in FIG. 2. For example, four memory cells M are series-connected. One terminal of the series-connected unit is connected to the common source line SRC via the selection transistor S, and the other terminal is connected to the bit line BL via the selection transistor S.

Assume that WL2 is a selected word line in a selected block. In a write, 20V is applied to the selected word line WL2, and 10V is applied to non-selected word lines WL1, WL3, and WL4 in the selected block. The power supply voltage VCC is applied to the selection gate SG1, while the selection gate SG2 is at 0V. All the word lines WL and all the selection gates SG in non-selected blocks are at 0V.

For example, in writing data "1", "2", and "3" in 4-valued storage, the bit line BL is set at 0V. Then, in a selected memory cell, electrons are injected into the floating gate, and the threshold voltage becomes positive. In writing data "0", the bit line BL is set at, e.g., the power supply voltage VCC. In this case, no electrons are injected into the floating gate. The voltage of the bit line BL in writing data "1", "2", and "3" may not be 0V. For example, the voltage of the bit line BL in writing data "1" may be set at 0.8V, and the voltage in writing data "2" and "3" may be at 0V. This is because the number of electrons injected into the floating gate of the memory cell M to store data "1" suffices to be smaller than the number of electrons injected to store data "2" and "3". The different voltages of the bit line BL may be used in writing data "1", "2", and "3", e.g., 0.8V, 0.4V, and 0V, respectively.

In an erase, the substrate voltage Vsub is set at 20V. The selection gates SG1 and SG2, the source line SRC, and the bit line BL are also set at 20V. The word lines WL1 to WL4 of an erase block are set at 0V, then electrons are discharged from the floating gate, and the threshold voltage becomes negative (data "0" state). The word lines WL1 to WL4 of an unerased block are set at 20V, and no electrons are discharged from the floating gate.

For example, in 4-valued storage, the threshold voltage of the memory cell corresponding to data "0" is set at 0V or less, the threshold voltage corresponding to data "1" is at 0.4V to 0.8V, the threshold voltage corresponding to data "2" is at 1.2V to 1.6V, and the threshold voltage corresponding to data "3" is at 2.0V to 2.4V.

In a read, the selected word line WL2 in the selected block is set at a read voltage Vread (to be described later). The non-selected word lines WL1, WL3, and WL4 in the selected block are set at, e.g., 3V.

The selection gates SG1 and SG2 in the selected block are also set at 3V. All the word lines WL and all the selection gates SG in non-selected blocks are at 0V. The source line SRC is grounded to 0V via the parasitic resistance.

When no common source line voltage increases by the parasitic resistance, (1) Vread is set at 0V. If data "1", "2", or "3" is stored in the selected memory cell, the voltage of the bit line in the floating state charged to the power supply voltage VCC is kept at VCC. If data "0" is stored in the selected memory cell, the voltage of the bit line in the floating state which is charged to VCC decreases to 0V.

(2) Vread is set at 1V. If data "2" or "3" is stored in the selected memory cell, the voltage of the bit line in the floating state which is charged to VCC is kept at VCC. If data "0" or "1" is stored in the selected memory cell, the voltage of the bit line in the floating state which is charged to VCC decreases to 0V.

(3) Vread is set at 1.8V. If data "3" is stored in the selected memory cell, the voltage of the bit line in the floating state which is charged to VCC is kept at VCC. If data "0", "1", or "2" is stored in the selected memory cell, the voltage of the bit line in the floating state which is charged to VCC decreases to 0V.

From (1) to (3), data stored in the memory cell M is determined.

Figure 5:
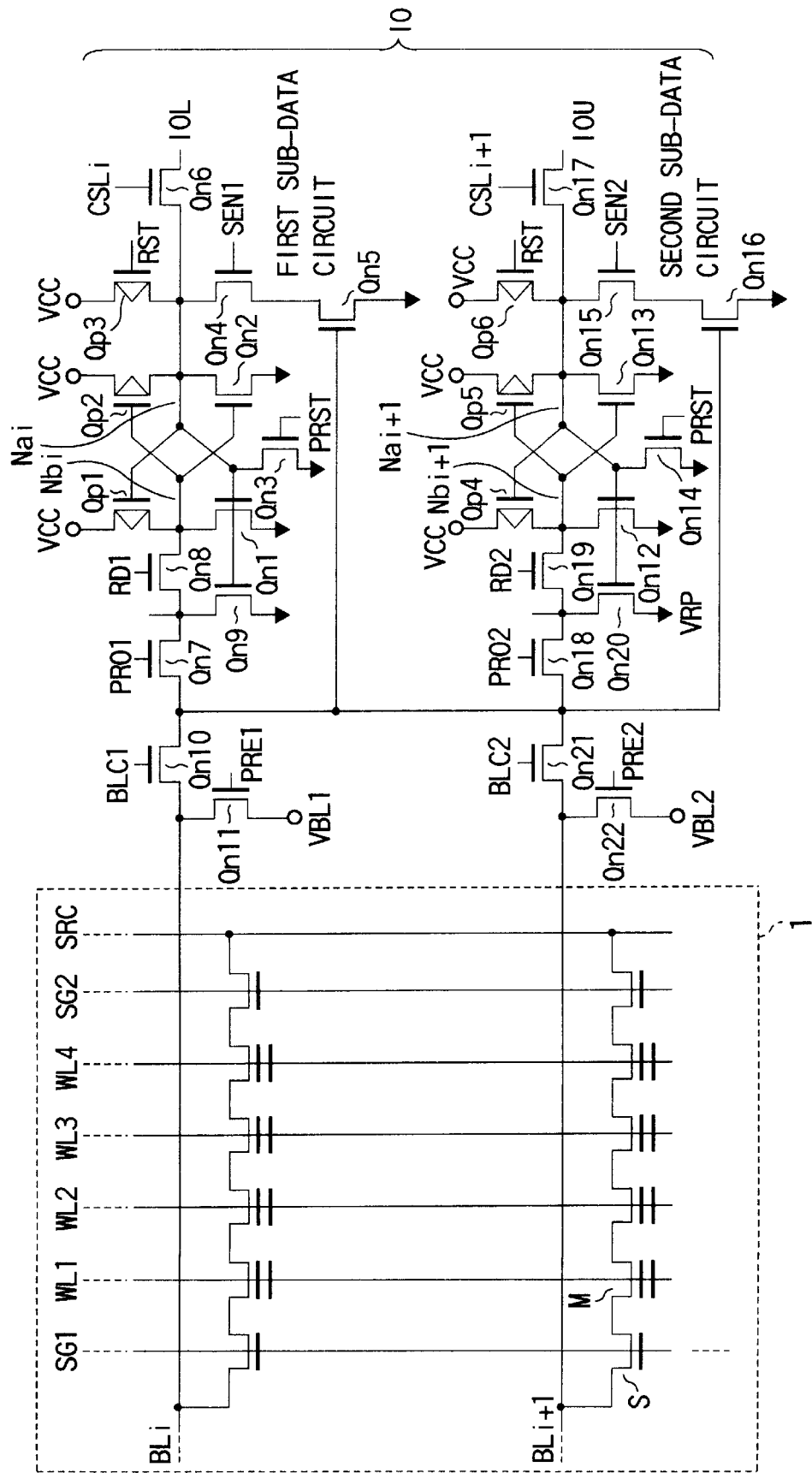
FIG. 5 is a circuit diagram showing the first example of the detailed arrangement of the data memory circuit connected to the memory cell array shown in FIG. 2.

FIG. 5 is a circuit diagram showing the first example of the detailed arrangement of the data memory circuit 10 connected to the memory cell array 1 shown in FIG. 2. The arrangement of a 4-valued storage flash memory will be exemplified. P-channel MOS transistors Qp1 and Qp2 and n-channel MOS transistors Qn1, Qn2, Qn4, Qn5, and Qn8 constitute a first sub-data circuit. P-channel MOS transistors Qp4 and Qp5 and n-channel MOS transistors Qn12, Qn13, Qn15, Qn16, and Qn19 constitute a second sub-data circuit.

In a write, first and second sub-data are respectively stored in the first and second sub-data circuits. In a read, first and second read sub-data are respectively stored in the first and second sub-data circuits. That is, the transistors Qp1, Qp2, Qn1, and Qn2 constitute a data latch circuit in the first sub-data circuit, whereas the transistors Qp4, Qp5, Qn12, and Qn13 constitute a data latch circuit in the second sub-data circuit.

P-channel MOS transistors Qp3 and Qp6 are used to respectively reset the first and second sub-data circuits. Upon resetting, a node Nai in the first sub-data circuit changes to "H" (High) level. In this state, first read sub-data "1" or first sub-data "1" is stored in the first sub-data circuit. Upon resetting, a node Nai+1 in the second sub-data circuit changes to "H" level. In this state, second read sub-data "1" or second sub-data "1" is stored in the second sub-data circuit. When the node Nai in the first sub-data circuit is at "L" (Low) level, first read sub-data "0" or first sub-data "0" is stored in the first sub-data circuit. When the node Nai+1 in the second sub-data circuit is at "L" level, second read sub-data "0" or second sub-data "0" is stored in the second sub-data circuit.

N-channel MOS transistors Qn6 and Qn17 are used to respectively electrically connect the first and second sub-data circuits to data I/O lines IOL and IOU. The gate electrodes of the transistors Qn6 and Qn17 respectively receive outputs CSLi and CSLi+1 from the column decoder 3. For example, when CSLi changes to "H", the first sub-data circuit of the data memory circuit 10 connected to the bit lines BLi and BLi+1 is electrically connected to the data I/O line IOL.

The data I/O lines IOL and IOU are connected to the data I/O buffer 4 in FIG. 1, and can set sub-data in the first sub-data circuit or can output read sub-data from the first sub-data circuit to the data I/O buffer 4. N-channel MOS transistors Qn3 and Qn14 are used to respectively preset sub-data "0" in the first and second sub-data circuits. Upon presetting, the node Nai in the first sub-data circuit changes to "L" level. Upon presetting, the node Nai+1 in the second sub-data circuit changes to "L" level.

N-channel MOS transistors Qn7 and Qn8 control the voltage of the bit line BLi or BLi+1 in accordance with the first sub-data stored in the first sub-data circuit. N-channel MOS transistors Qn18 and Qn19 control the voltage of the bit line BLi or BLi+1 in accordance with the second sub-data stored in the second sub-data circuit.

N-channel MOS transistors Qn7 and Qn9 change the voltage of the bit line BLi or BLi+1 to 0V when first sub-data "1" is stored in the first sub-data circuit. N-channel MOS transistors Qn18 and Qn20 change the voltage of the bit line BLi or BLi+1 to VRP when second sub-data "1" is stored in the second sub-data circuit.

N-channel MOS transistors Qn10 and Qn21 control electrical connection between the first and second sub-data circuits and the bit line BLi or BLi+1. If a signal BLC1 is at "H" level, and BLC2 is at "L" level, the first and second sub-data circuits are electrically connected to the bit line BLi. If the signal BLC1 is at "L" level, and BLC2 is at "H" level, the first and second sub-data circuits are electrically connected to the bit line BLi+1.

N-channel MOS transistors Qn11 and Qn22 control electrical connection between the bit line BLi and a voltage VBL1 and electrical connection between the bit line BLi+1 and a voltage VBL2. If a signal PRE1 is at "H" level, the bit line BLi is electrically connected to the voltage VBL1. If a signal PRE2 is at "H" level, the bit line BLi+1 is electrically connected to the voltage VBL2.

Signals RST, SEN1, SEN2, RD1, RD2, PRO1, PRO2, PRST, BLC1, BLC2, PRE1, and PRE2, and voltages VRP, VBL1, and VBL2 are output signals from the control signal/control voltage generator 7 in FIG. 1, and are common to all the data memory circuits 10 in FIG. 2. The data I/O lines IOL and IOU are connected to the data I/O buffer 4 and are common to all the data memory circuits 10 in FIG. 2. The voltage VCC is a power supply voltage, e.g., 3.3V.

Sub-data "0" or "1" is stored in the first and second sub-data circuits. The first and second sub-data circuits change stored sub-data "1" to sub-data "0" in response to an "H"-level bit line signal, and hold sub-data "0". Read sub-data "0" or "1" is stored in the first and second sub-data circuits.

The first and second sub-data circuits change stored read sub-data "1" to read sub-data "0" in response to an "H"-level bit line signal, and hold read sub-data "0".

Regardless of the detailed circuit arrangement of this embodiment, the present invention can be practiced using various circuits having the above functions. In the sub-data circuit of this embodiment, when the signal SEN1 or SEN2 changes to "H" level, and an "H"-level signal of the bit line BL is transferred to the gate electrode of the n-channel MOS transistor Qn5 or Qn16, the n-channel MOS transistor Qn5 or Qn16 is turned on to change the node Nai or Nai+1 to "L" level. Then, sub-data or read sub-data "1" changes to sub-data or read sub-data "0". Sub-data or read sub-data "0" is not changed because the node Nai or Nai+1 is originally at "L" level. Sub-data or read sub-data is not changed by an "L"-level signal of the bit line BL because the n-channel MOS transistor Qn5 or Qn16 is kept off.

Figure 6:
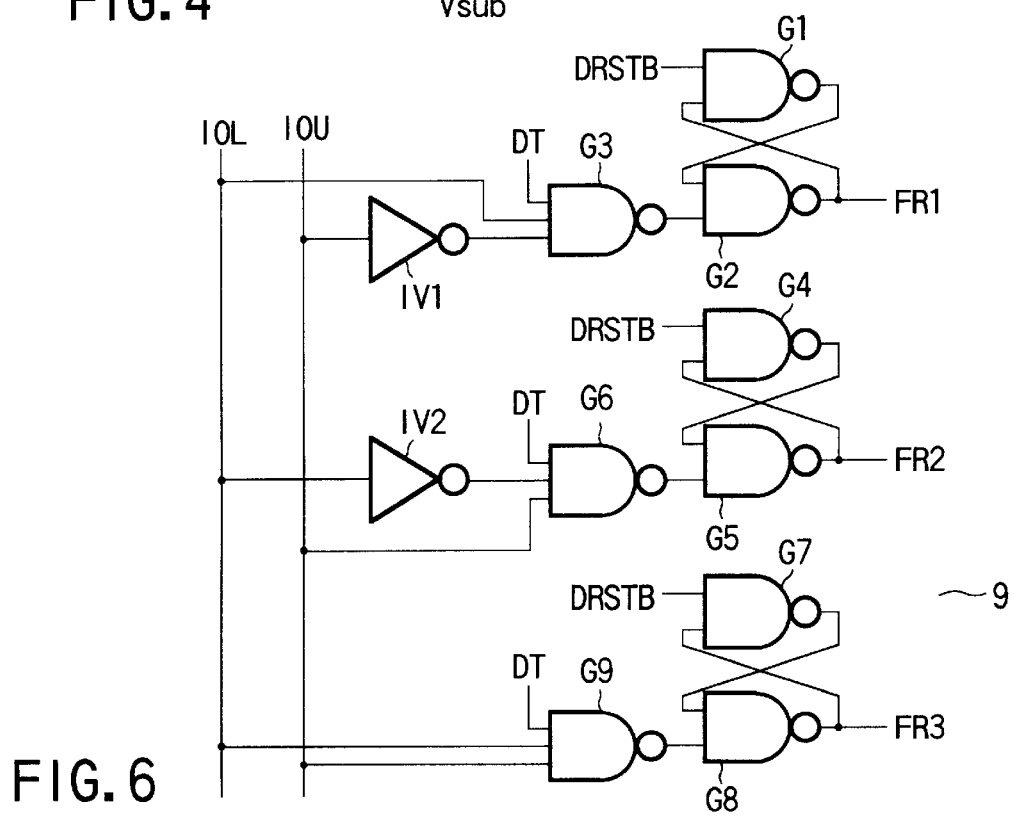
FIG. 6 is a circuit diagram showing the detailed arrangement of a data detector shown in FIG. 1.

FIG. 6 shows the detailed arrangement of the data detector 9 shown in FIG. 1. The circuit constituted by an inverter IV1 and NAND circuits G1, G2, and G3 detects whether control data "1" is stored in the data memory circuit 10 (see FIGS. 2 and 5). When even one data memory circuit 10 holds control data "1", a signal FR1 changes to "H". The circuit constituted by an inverter IV2 and NAND circuits G4, G5, and G6 detects whether control data "2" is stored in the data memory circuit 10. When even one data memory circuit 10 holds control data "2", a signal FR2 changes to "H". The circuit constituted by NAND circuits G7, G8, and G9 detects whether control data "3" is stored in the data memory circuit 10. When even one data memory circuit 10 holds control data "3", a signal FR3 changes to "H".

For an "H"-level signal DT, the control data of the data memory circuit 10 is detected via the data I/O lines IOL and IOU. When a signal DRSTB changes to "L" level, the signals FR1, FR2, and FR3 are reset at "L" level. The signals DT and DRSTB are output signals from the control signal/control voltage generator 7. The signals FR1, FR2, and FR3 are fed back to the control signal/control voltage generator 7.

Figure 7:
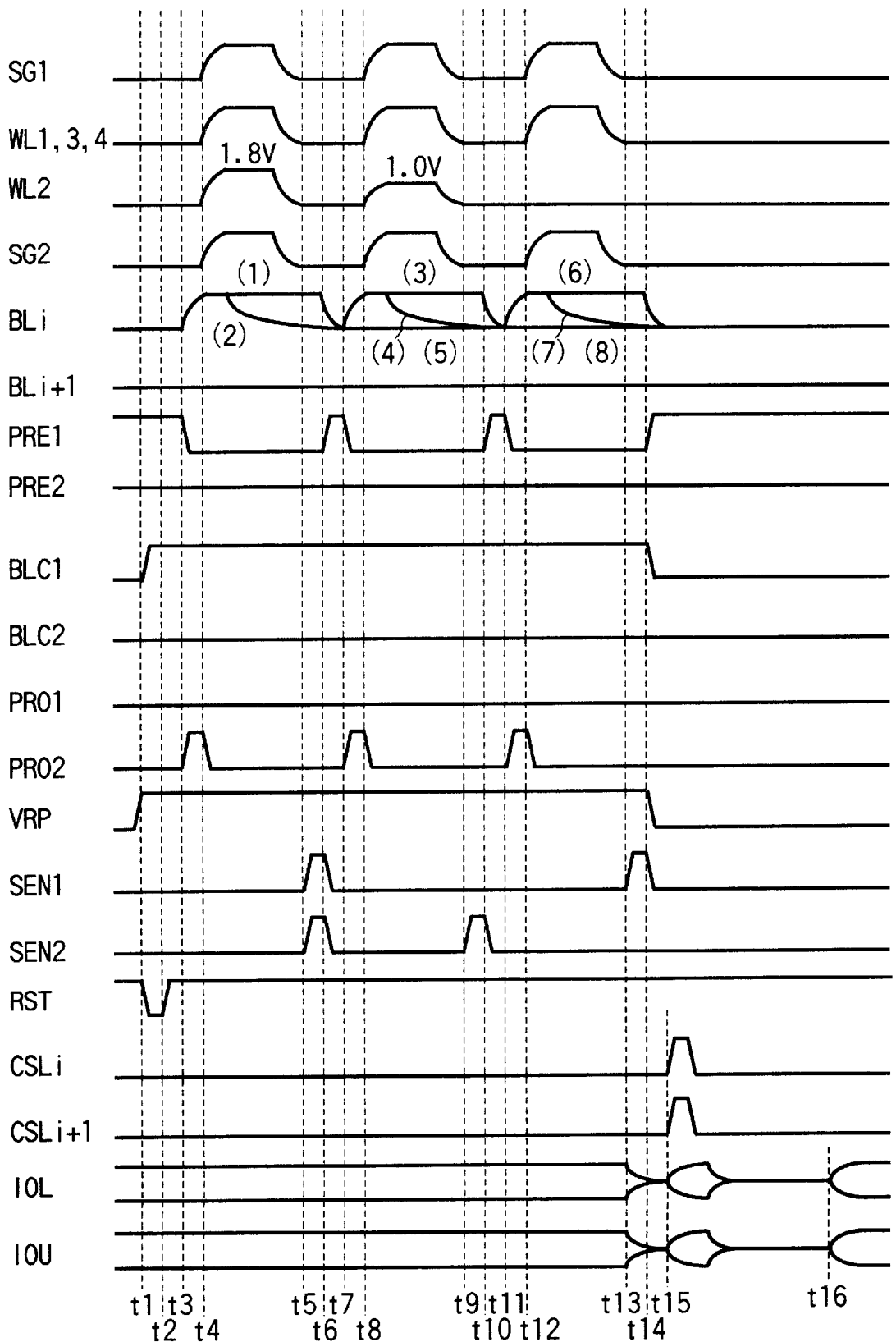
FIG. 7 is a waveform chart showing the read of 4-valued data stored in the memory cell and showing a change in voltage at each portion in FIG. 5.

FIG. 7 is a waveform chart showing the read of 4-valued data stored in the memory cell and showing a change in voltage at each portion in FIG. 5. FIG. 5 shows the case wherein the bit lines BL0, BL2, . . . , BLi, . . . , BL4222 are selected (BLi is shown as a representative), and the word line WL2 is selected. In this case, 4-valued storage is exemplified, but 3-valued storage can be easily implemented by limiting the number of storage levels to three. During a read, the voltages VBL1 and VBL2 (see FIG. 5) are 0V.

First, the signal BLC1 changes to "H" to select the bit line BLi (t1). By the signal RST, first and second read sub-data "1" are respectively set in the first and second sub-data circuits (t1 and t2). The voltage VRP changes to the power supply voltage VCC (t1). The signal PRE1 changes to "L" level to electrically disconnect the bit line BLi and the voltage VBL1 (t3). The signal PRO2 changes to "H" level (t3) to charge the bit line BLi to "H" level by the second sub-data circuit (t3 and t4). The selection gates SG1 and SG2 and the non-selected word lines WL1, WL3, and WL4 in the selected block increase in voltage to 3V, while the selected word line WL2 increases in voltage to 1.8V (t4).

Table 1 shows the relationship between data stored in the memory cell M and the threshold voltage.

TABLE 1

| Data Stored in Memory Cell | Threshold Voltage of Memory Cell |
| --- | --- |
| 0 | 0 V or less |
| 1 | between 0.4 V and 0.8 V |
| 2 | between 1.2 V and 1.6 V |
| 3 | between 2.0 V and 2.4 V |

After the voltage of the selected word line WL2 reaches 1.8V, the bit line BLi maintains "H" level only when data "3" is stored in the memory cell ((1) in FIG. 7). Otherwise, the bit line BLi changes to "L" level ((2) in FIG. 7). Subsequently, the signals SEN1 and SEN2 change to "H" level to read out the modulated voltage of the bit line BLi (t5 and t6). Only when data "3" is stored in the memory cell, the first and second read sub-data in both the first and second sub-data circuits change to "0". Otherwise, the first and second read data remain "1".

The signal PRE1 changes to "H" level (t6 and t7) to reset the bit line BLi to 0V. After that, the signal PRO2 changes to "H" level (t7 and t8). Only when the second read sub-data is "1", the bit line BLi is charged to "H" level by the voltage VRP (t7 and t8). When the second read sub-data stored in the second sub-data circuit is "0", the bit line BLi maintains "L" level ((5) in FIG. 7). The selection gates SG1 and SG2 and the non-selected word lines WL1, WL3, and WL4 in the selected block increase in voltage to 3V, while the selected word line WL2 increases in voltage to 1V (t8).

After the voltage of the selected word line WL2 reaches 1V, the bit line BLi maintains "H" level only when data "2" is stored in the memory cell ((3) in FIG. 7). When data "1" or "0" is stored in the memory cell, the bit line BLi changes to "L" level ((4) in FIG. 7). Subsequently, the signal SEN2 changes to "H" level to read out the modulated voltage of the bit line BLi (t9 and t10). Only when data "2", is stored in the memory cell, the second read sub-data changes from "1" to "0". When data "1" or "0" is stored in the memory cell, the second read data remains "1". When data "3" is stored in the memory cell, the second read sub-data has already changed to "0".

The signal PRE1 changes to "H" level (t10 and t11) to reset the bit line BLi to 0V. Then, the signal PRO2 changes to "H" level (t11 and t12). Only when the second read sub-data is "1", the bit line BLi is charged to "H" level by the voltage VRP (t11 and t12). When the second read sub-data stored in the second sub-data circuit is "0", the bit line BLi maintains "L" level ((8) in FIG. 7). The selection gates SG1 and SG2 and the non-selected word lines WL1, WL3, and WL4 in the selected block increase in voltage to 3V, while the selected word line WL2 is kept at 0V (t12).

After the selected word line WL2 is at 0V, the bit line BLi maintains THE level only when data "1" is stored in the memory cell ((6) in FIG. 7). When data "0" is stored in the memory cell, the bit line BLi changes to "L" level ((7) in FIG. 7). The signal SEN1 changes to "H" level to read out the changed voltage of the bit line BLi (t13 and t14). Only when data "1" is stored in the memory cell, the first read sub-data changes from "1" to "0". When data "0" is stored in the memory cell, the first read data remains "1". When data "3" is stored in the memory cell, the first read sub-data has already changed to "0". When data "2" is stored in the memory cell, the voltage of the bit line BLi is kept at "L" level regardless of the memory cell, so that the first read sub-data remains "1".

When the signals CSLi and CSLi+1 change to "H" level, the first read sub-data is output to the data I/O line IOL and then to the outside from the I/O terminal 5 via the data I/O buffer 4. The second read sub-data is output to the data I/O line IOU and then to the outside from the I/O terminal 5 via the data I/O buffer 4. The first and second read sub-data at arbitrary column addresses can be output in accordance with a signal CSL selected by the column decoder 3. During a read, the non-selected bit line BLi+1 is fixed at the voltage VBL2, e.g., 0V.

Table 2 shows the relationship between 4-valued data and the first and second read sub-data in the memory cell.

TABLE 2

| Data stored in Memory Cell | First Read Sub-Data | Second Read Sub-Data |
| --- | --- | --- |
| 0 | 1 | 1 |
| 1 | 0 | 1 |
| 2 | 1 | 0 |
| 3 | 0 | 0 |

Figure 8:
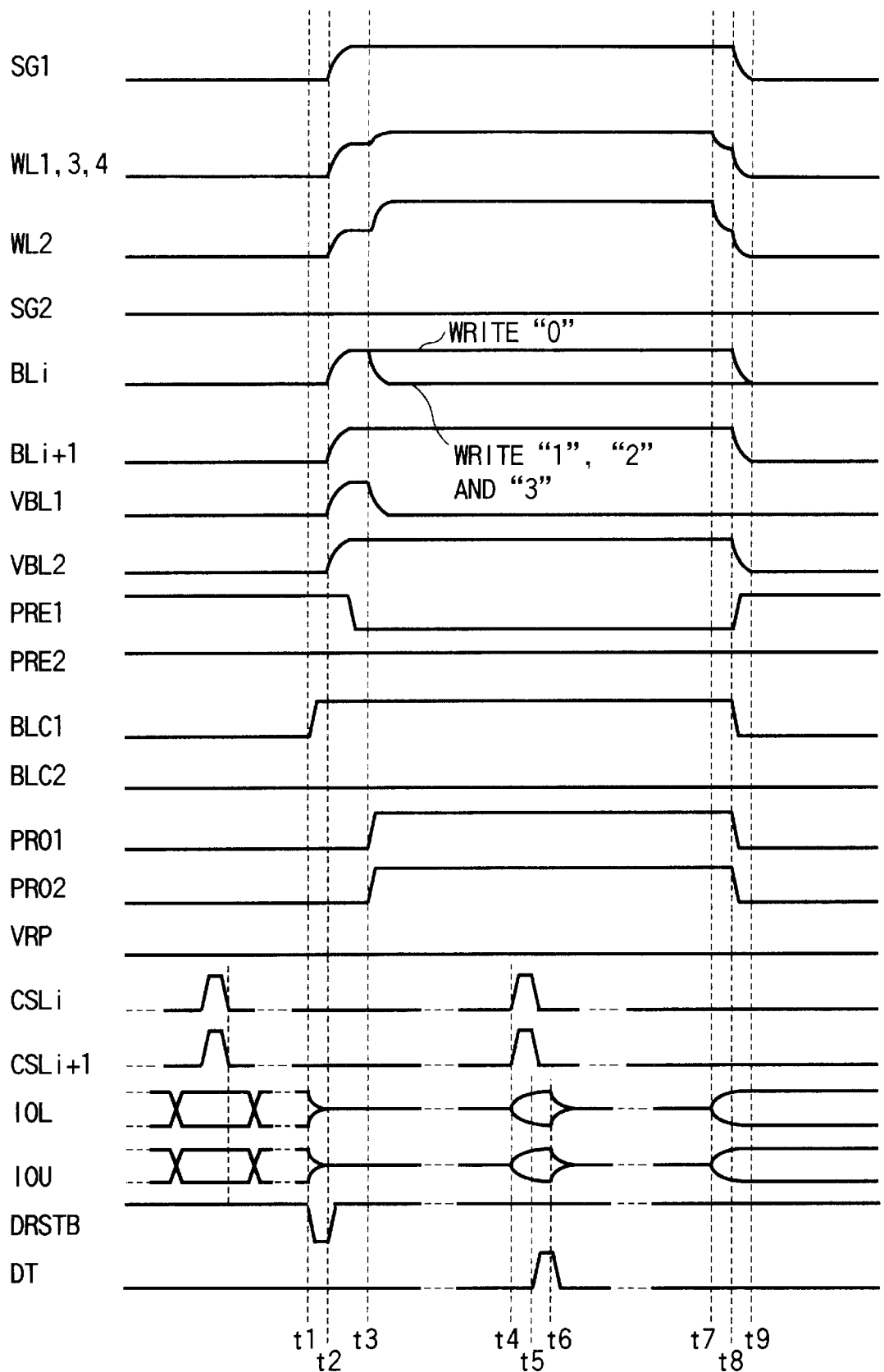
FIG. 8 is a waveform chart showing the initial setting and write of control data in the data memory circuit in FIG. 5 and showing a change in voltage at each portion in FIGS. 5 and 6.

FIG. 8 is a waveform chart showing the initial setting and write of control data in the data memory circuit 10 and showing a change in voltage at each portion in FIGS. 5 and 6. FIG. 8 shows the case wherein the bit lines BL0, BL2, . . . , BLi, . . . , BL4222 are selected (BLi is shown as a representative), and the word line WL2 is selected. In this case, 3-valued storage can be easily implemented by limiting the number of storage levels to three.

The initial setting of control data in the data memory circuit 10 connected to the bit line BLi is performed as follows. Initial sub-data for the first sub-data circuit is transferred to the data I/O line IOL to change the signal CSLi to "H" level and store the initial sub-data in the first sub-data circuit. At the same time, initial sub-data for the second sub-data circuit is transferred to the data I/O line IOU to change the signal CSLi+1 to "H" level and store the initial sub-data in the second sub-data circuit. Table 3 shows the relationship between the initial control data and the initial sub-data in this case.

TABLE 3

| Initial Control Data | Initial Sub-Data of First Sub-Data Circuit | Initial Sub-Data of Second Sub-Data Circuit |
| --- | --- | --- |
| 0 | 0 | 0 |
| 1 | 1 | 0 |
| 2 | 0 | 1 |
| 3 | 1 | 1 |

It is desirable to change the signal PRST to "H" level and preset the control data of all the data memory circuits 10 at "0" before setting all the initial control data. As will be described later, since the state of the memory cell M is not changed by control data "0", the initial control data is externally set in only desired data memory circuits of the 2,112 data memory circuits 10. As a matter of course, the initial control data can be externally set in all the 2,112 data memory circuits 10.

In a write, the signal BLC1 changes to "H" level to select the bit line BLi (t1). The signal DRSTB changes to "L" level to reset the data detector 9 (t1 and t2).

The voltage VBL1 increases to VCC, which is transferred to the bit line BLi via the n-channel MOS transistor Qn11 to charge the bit line BLi to VCC. The signal PRE1 changes to "L" level to float the selected bit line BLi (t2 and t3). The voltage VBL2 increases to VCC, which is transferred to the non-selected bit line BLi+1 via the n-channel MOS transistor Qn22 to charge the non-selected bit line BLi+1 to VCC (t2 and t3). The selection gate SG1 and the word lines WL1 to WL4 increase in voltage to VCC (t2 and t3).

If the signals PRO1 and PRO2 change to "H" level, and either one of the first and second sub-data is "1", the selected bit line BLi decreases in voltage to 0V by the n-channel MOS transistor Qn9 or Qn20 (t3). Accordingly, the bit line BLi increases in voltage to VCC for control data "0" and decreases in voltage to 0V for control data "1", "2", or "3". The selected word line WL2 increases in voltage to 20V, the non-selected word line increases in voltage to 10V, and electron injection into the floating gate of the memory cell starts in accordance with the control data (t3). When the bit line BL is at 0V, electron injection occurs at a voltage difference of 20V between the memory cell channel and the word line. When the bit line BL is at VCC, the memory cell channel is boosted by capacitive coupling of the word lines WL1 to WL4, and no electron injection substantially occurs due to a small voltage difference between the memory cell channel and the word line.

While the selected word line WL2 is kept at 20V (t3 to t7), control data stored in the data memory circuit 10 is detected. The column decoder 3 sequentially selects CSL0, CSL1, . . . , CSL4222, and CSL4223, and control data is transferred to the data detector 9 via the data I/O lines IOL and IOU. FIG. 8 shows the case wherein CSLi and CSLi+1 are selected. CSLi and CSLi+1 change to "H" level (t4 and t5) to output the control data to the data I/O lines IOL and IOU. The signal DT changes to "H" level to detect the control data by the data detector 9 (t5 and t6).

At this time, if data "1" is stored in even one data memory circuit 10, the signal FR1 changes to "H" level. If data "2" is stored in even one data memory circuit 10, the signal FR2 changes to "H" level. If data "3" is stored in even one data memory circuit 10, the signal FR3 changes to "H" level.

After the word lines WL1 to WL4 decrease in voltage to VCC (t7 and t8), the voltage VBL2 decreases to 0V, and the signal PRE1 changes to "H" level to reset the bit lines BLi and BLi+1 to 0V (t8 and t9). The voltage VBL1 remains 0V. The word lines WL1 to WL4 are also reset to 0V (t8 and t9).

Figure 9:
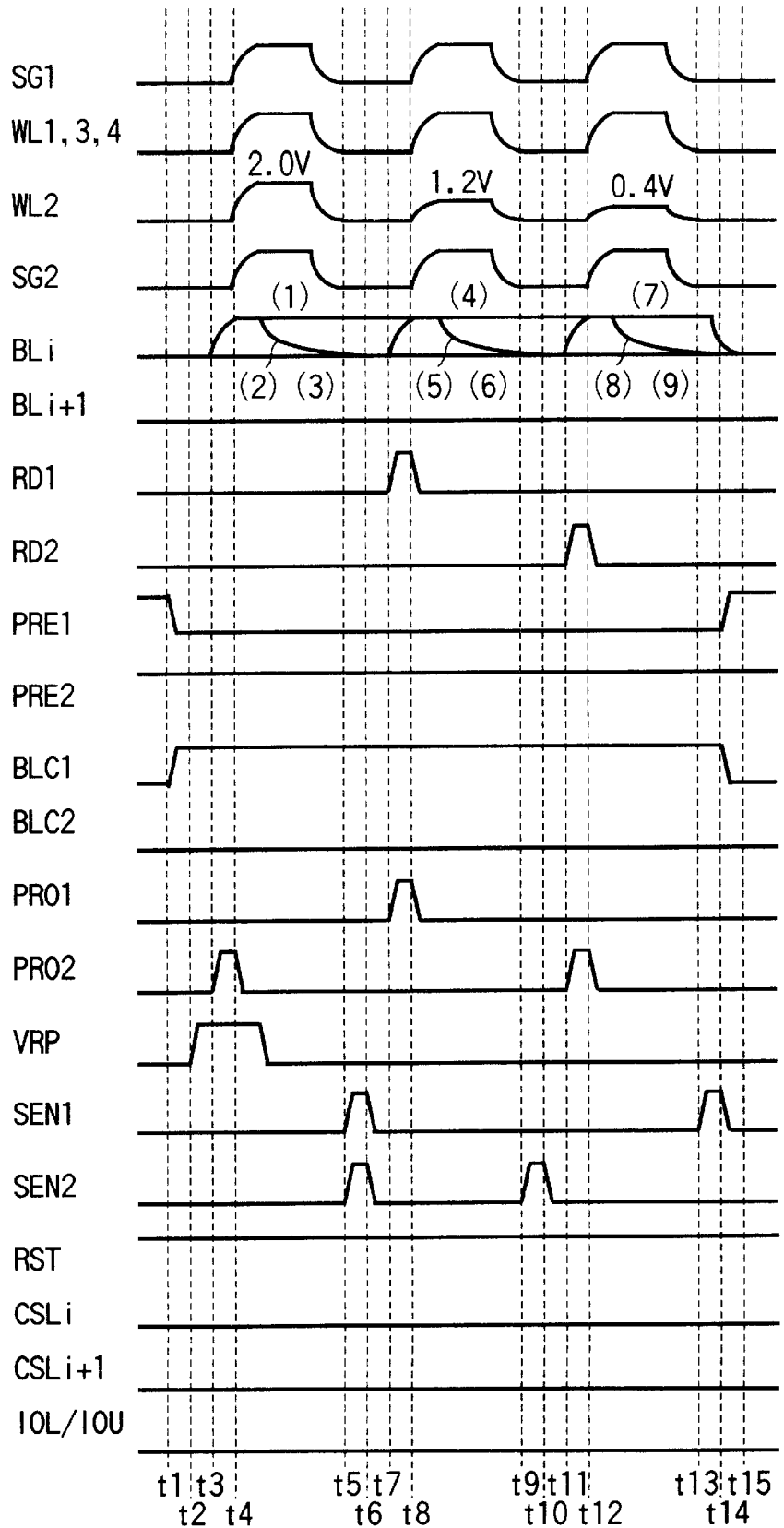
FIG. 9 is a waveform chart showing a write verify for detecting the write state of the memory cell after a write at times t1 to t9 shown in FIG. 8.

FIG. 9 is a waveform chart showing a write verify for detecting the write state of the memory cell after a write at times t1 to t9 shown in FIG. 8. FIG. 9 shows the case wherein the bit lines BL0, BL2, . . . , BLi, . . . , BL4222 are selected (BLi is shown as a representative), and the word line WL2 is selected. The voltages VBL1 and VGL2 in FIG. 5 are 0V.

The signal PRE1 changes to "L" level to disconnect the bit line BLi from the voltage VBL1 and float the bit line BLi at 0V (t1). At the same time, the signal BLC1 changes to "H" level to select the bit line BLi (t1).

When the voltage VRP increases to the power supply voltage (t2) to change the signal PRO2 to "H" level (t3), bit lines BLi corresponding to data memory circuits in which control data "3" and "2" are stored are charged to "H" level by the n-channel MOS transistor Qn20 (t3 and t4). Bit lines BL corresponding to data memory circuits in which control data "1" and "0" are stored maintain "L" level.

The selection gates SG1 and SG2 and the non-selected word lines WL1, WL3, and WL4 in the selected block increase in voltage to 3V, while the selected word line WL2 increases in voltage to 2V (t4). After the voltage of the selected word line WL2 reaches 2V, if data "3" is stored in a memory cell corresponding to a data memory circuit in which control data "3" is stored, a corresponding bit line BLi maintains "H" level ((1) in FIG. 9). Otherwise, a corresponding bit line BLi changes to "L" level ((2) in FIG. 9). Since no data "3" is stored in a memory cell corresponding to a data memory circuit in which control data "2" is stored, a corresponding bit line BLi changes to "L" level ((2) in FIG. 9). Bit lines BLi corresponding to data memory circuits in which control data "1" and "0" are stored maintain "L" level ((3) in FIG. 9).

The signals SEN1 and SEN2 change to "H" level to read out the modulated voltage of the bit line BLi (t5 and t6). Only when data "3" is stored in a memory cell corresponding to a data memory circuit in which control data "3", is stored, the first and second sub-data in both the first and second sub-data circuits change to "0" to change the control data to "0". Otherwise, the first and second sub-data are held. The operation from time t2 to t6 is the verify read of data "3".

The signals PRO1 and RD1 change to "H" level (t7), and bit lines BLi corresponding to data memory circuits in which control data "2" and "0" are stored are charged to "H" level by the first sub-data circuit (t7 and t8). Bit lines BLi corresponding to data memory circuits in which control data "3", and "1" are stored are changed to "L" level by the first sub-data circuit (t7 and t8).

The selection gates SG1 and SG2 and the non-selected word lines WL1, WL3, and WL4 in the selected block increase in voltage to 3V, while the selected word line WL2 increases in voltage to 1.2V (t8). After the voltage of the selected word line WL2 reaches 1.2V, if data "2" is stored in a memory cell corresponding to a data memory circuit in which control data "2" is stored, a corresponding bit line BLi maintains "H" level ((4) in FIG. 9). Otherwise, a corresponding bit line BLi changes to "L" level ((5) in FIG. 9). If data "2" or "3" is stored in a memory cell corresponding to a data memory circuit in which control data "0" is stored, a corresponding bit line BLi maintains "H" level ((4) in FIG. 9). If no data "2" is stored in a memory cell corresponding to a data memory circuit in which control data "0" is stored, a corresponding bit line BLi changes to "L" level ((5) in FIG. 9). Bit lines BLi corresponding to data memory circuits in which control data "3" and "1" are stored maintain "L" level ((6) in FIG. 9).

The signal SEN2 changes to "H" level to read out the modulated voltage of the bit line BLi (t9 and t10). Only when data "2" is stored in a memory cell corresponding to a data memory circuit in which control data "2" is stored, the second sub-data in the second sub-data circuit changes to "0" to change the control data to "0". Otherwise, the second sub-data is held. The operation from time t7 to t10 is the verify read of data "2".

The signals PRO2 and RD2 change to "H" level (t11), and bit lines BLi corresponding to data memory circuits in which control data "1" and "0" are stored are charged to "H" level by the second sub-data circuit (t11 and t12). Bit lines BLi corresponding to data memory circuits in which control data "3" and "2" are stored are changed to "L" level by the second sub-data circuit (t11 and t12).

The selection gates SG1 and SG2 and the non-selected word lines WL1, WL3, and WL4 in the selected block increase in voltage to 3V, while the selected word line WL2 increases in voltage to 0.4V (t12). After the voltage of the selected word line WL2 reaches 0.4V, if data "1" is stored in a memory cell corresponding to a data memory circuit in which control data "1" is stored, a corresponding bit line BLi maintains "H" level ((7) in FIG. 9). Otherwise, a corresponding bit line BLi changes to "L" level ((8) in FIG. 9). If data "1", "2", or "3" is stored in a memory cell corresponding to a data memory circuit in which control data "0" is stored, a corresponding bit line BLi maintains "H" level ((7) in FIG. 9). If no data "1" is stored in a memory cell corresponding to a data memory circuit in which control data "0" is stored, a corresponding bit line BLi changes to "L" level ((8) in FIG. 9). Bit lines BLi corresponding to data memory circuits in which control data "3" and "2" are stored maintain "L" level ((9) in FIG. 9).

The signal SEN1 changes to "H" level to read out the modulated voltage of the bit line BLi (t13 and t14). Only when data "1" is stored in a memory cell corresponding to a data memory circuit in which control data "1" is stored, the first sub-data in the first sub-data circuit changes to "0" to change the control data to "0". Otherwise, the first sub-data is held. The operation from time t11 to t14 is the verify read of data "1".

At time t15, the signals PRE1 and BLC1 respectively change to "H" and "L" levels, thereby completing the write verify. The write verify changes the control data stored in the data memory circuit 10 from the write state of the memory cell to the state shown in Table 4.

TABLE 4

| Write State of Memory Cell | Control Data before Write Verify | Control Data after Write Verify |
| --- | --- | --- |
| 0, 1, 2, or 3 | 0 | 0 |
| 0, 1, 2, or 3 | 1 | 1 |
| 1 | 1 | 0 |
| Smaller than 2 | 2 | 2 |
| 2 | 2 | 0 |
| Smaller than 3 | 3 | 3 |
| 3 | 3 | 0 |

The verify read of data "3", the verify read of data "2", and the verify read of data "1" shown in FIG. 9 are selectively executed as follows:

(1) All the verify read of data "3", verify read of data "2", and verify read of data "1" are executed by the operation shown in FIG. 9.

(2) Only the verify read of data "3" and verify read of data "2" are executed by the operation shown in FIG. 9 except for the operation from time t11 to t14.

(3) Only the verify read of data "3" and verify read of data "1" are executed by the operation shown in FIG. 9 except for the operation from time t7 to t10.

(4) Only the verify read of data "3" is executed by the operation shown in FIG. 9 except for the operation from time t7 to t14.

(5) Only the verify read of data "2" and verify read of data "1" are executed by the operation shown in FIG. 9 except for the operation from time t2 to t6.

(6) Only the verify read of data "2" is executed by the operation shown in FIG. 9 except for the operations from time t2 to t6 and from time t11 to t14.

(7) Only the verify read of data "1" is executed by the operation shown in FIG. 9 except for the operation from time t2 to t10.

A write from t1 to t9 shown in FIG. 8 and a write verify shown in FIG. 9 are repeatedly performed to write (program) data in the memory cell M until all control data become "0".

Figure 10:
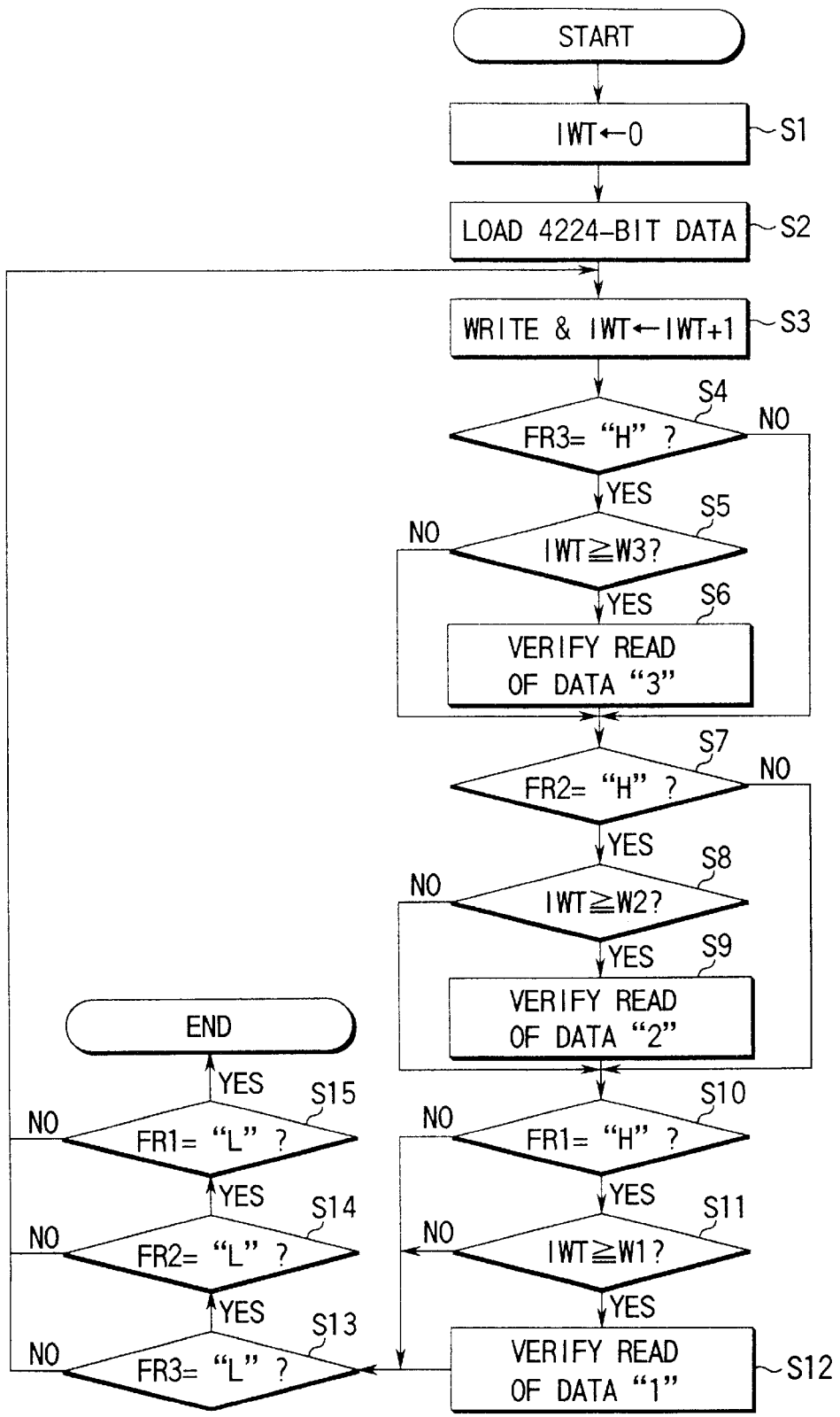
FIG. 10 is a flow chart showing detailed memory cell programming (data write) using the arrangements in FIGS. 5 and 6.

FIG. 10 is a flow chart showing detailed memory cell programming using the arrangements of the data memory circuit in FIG. 5 and the data detector in FIG. 6. This programming flow is controlled by the control signal/control voltage generator 7 shown in FIG. 1. The programming starts by a programming start command input to the control signal input terminal 8. A counter which is arranged in the control signal/control voltage generator 7 and counts a variable IWT is reset to set IWT at 0 (S1). Initial control data corresponding to 4,224 bits which is input to the I/O terminal 5 is loaded to the data memory circuit 10 (S2).

After loading, the data is written. At this time, the variable IWT is incremented by one (S3). Whether an output FR3 from the data detector 9 is at "H" level is checked (S4). If the output FR3 from the data detector 9 is at "H" level, and data "3" is left in the data memory circuit 10, whether the variable IWT is predetermined W3 or more is checked (S5). If YES in S5, the verify read of data "3" is performed (S6). If FR3 is at "L" level, or the variable IWT is smaller than W3, the verify read of data "3" is skipped.

Whether an output FR2 from the data detector 9 is at "H" level is checked (S7). If the output FR2 from the data detector 9 is at "H" level, and data "2" is left in the data memory circuit 10, whether the variable IWT is predetermined W2 or more is checked (S8). If YES in S8, the verify read of data "2" is performed (S9). If FR2 is at "L" level, or the variable IWT is smaller than W2, the verify read of data "2" is skipped.

Whether an output FR1 from the data detector 9 is at "H" level is checked (S10). If the output FR1 from the data detector 9 is at "H" level, and data "1" is left in the data memory circuit 10, whether the variable IWT is predetermined W1 or more is checked (S11). If YES in S11, the verify read of data "1" is performed (S12). If FR1 is at "L" level, or the variable IWT is smaller than W1, the verify read of data "1" is skipped.

If all the outputs FR3, FR2, and FR1 from the data detector 9 are at "L" level, the programming ends (S13, S14, and S15). If even one of the outputs FR3, FR2, and FR1 from the data detector 9 is at "H" level, the flow returns to a write (S3). Every time the variable IWT is incremented by one, the write voltage applied to the selected word line (selected word line voltage between times t3 and t7 shown in FIG. 8) increases by 0.4V, and the threshold voltage of the memory cell M in which data "1", "2", are "3" are to be written rises by almost 0.4V. The predetermined W1, W2, and W3 are determined as follows.

Figure 11:
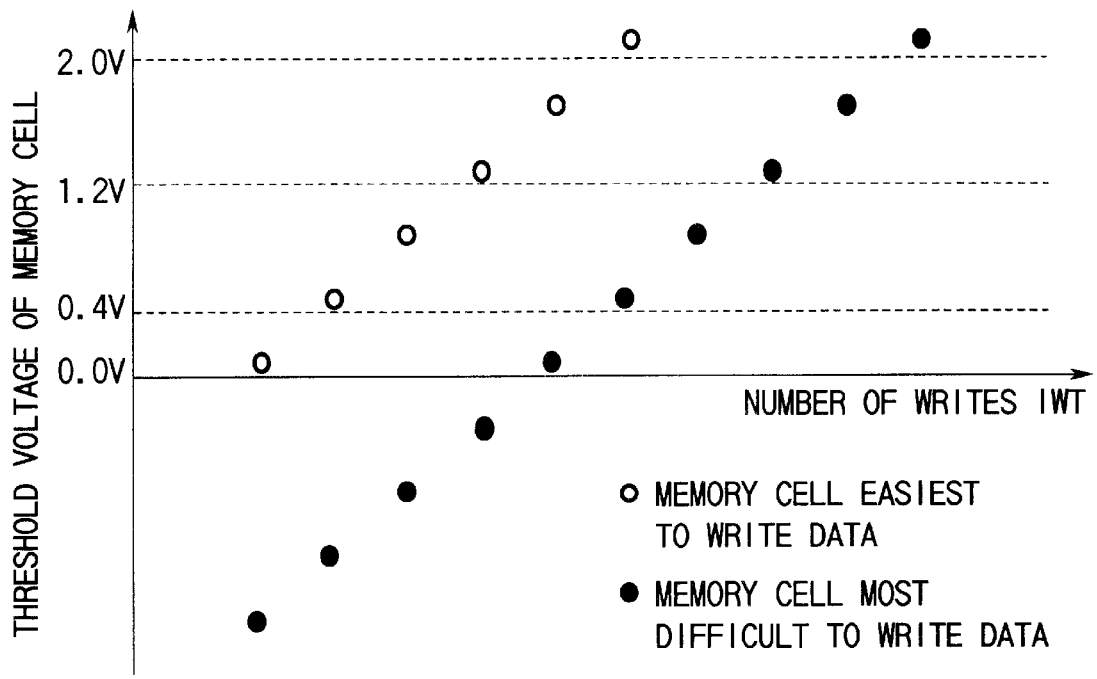
FIG. 11 is a graph showing an example of the write characteristics of the memory cell according to the present invention.

FIG. 11 is a graph showing the write characteristics of the memory cell M. The abscissa represents the number of writes IWT, and the ordinate represents the threshold voltages of a memory cell (○) easy to write data and a memory cell (●) most difficult to write data in correspondence with the number of writes IWT. The threshold voltage of the memory cell easiest to write data reaches 0.1V after the first write. At this time, the threshold voltage of the memory cell most difficult to write data is −1.5V. Every time the number of writes increases by one, the write voltage of the selected word line increases by 0.4V, and thus the threshold voltage of the memory cell also increases by almost 0.4V.

Since the threshold voltage of no memory cell reaches 0.4V after the first write, the verify read of data "3", "2", and "1" need not be performed. After the second write, the threshold voltage of the memory cell easiest to write data exceeds 0.4V, and the verify read of data "1" must be performed. Accordingly, W1 is determined as 2. After the fourth write, the threshold voltage of the memory cell easiest to write data exceeds 1.2V, and the verify read of data "2" must be performed. W2 is determined as 4. After the sixth write, the threshold voltage of the memory cell easiest to write data exceeds 2.0V, and the verify read of data "3" must be performed. W3 is determined as 6.

After the sixth write, the threshold voltage of even the memory cell most difficult to write data exceeds 0.4V. For IWT=7 or more, therefore, the output FR1 from the data detector changes to "L" level. After the eighth write, the threshold voltage of even the memory cell most difficult to write data exceeds 1.2V. For IWT=9 or more, the output FR2 from the data detector changes to "L" level. After the 10th write, the threshold voltage of even the memory cell most difficult to write data exceeds 2.0V. For IWT=11 or more, the output FR3 from the data detector changes to "L" level.

Figure 12:
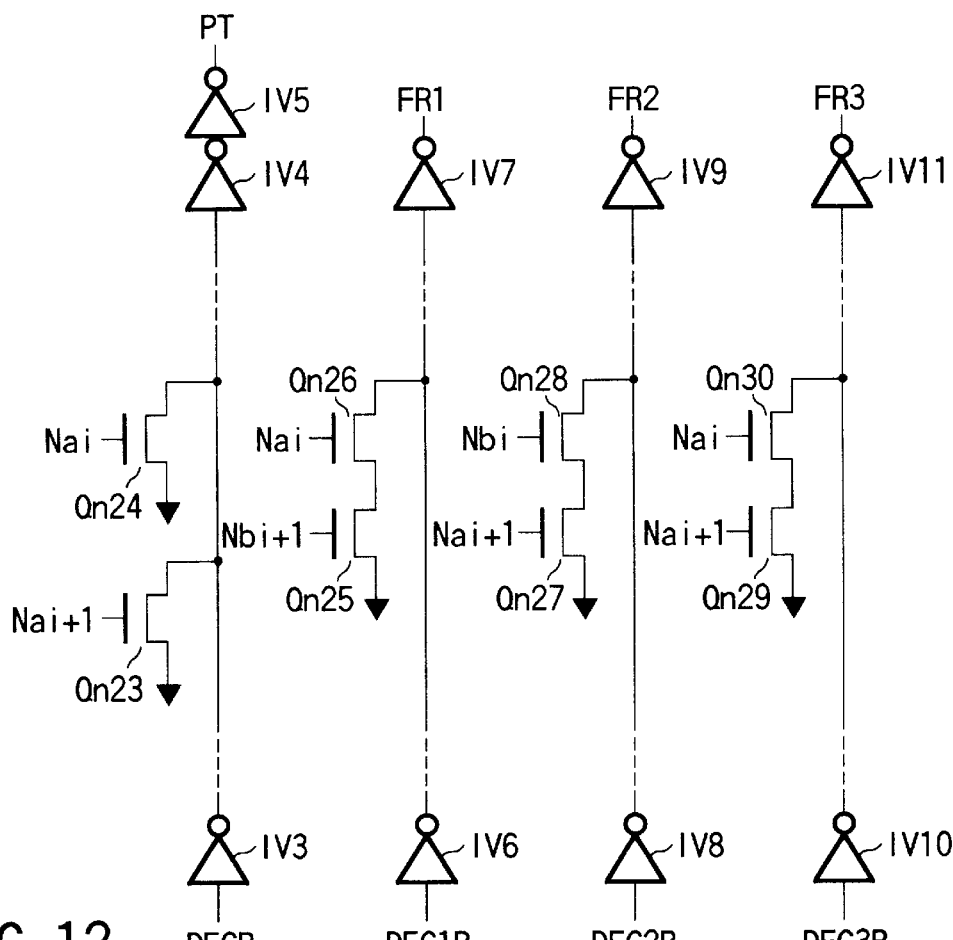
FIG. 12 is a circuit diagram showing the detailed arrangement of a modification of the data detector in FIG. 6.

FIG. 12 shows a modification of the data detector 9. N-channel MOS transistors Qn23, Qn24, Qn25, Qn26, Qn27, Qn28, Qn29, and Qn30 are respectively formed adjacent to or near corresponding data memory circuits 10 shown in FIG. 2. The gate electrode of Qn23 is connected to the node Nai+1 of the second sub-data circuit shown in FIG. 5. The gate electrode of Qn24 is connected to the node Nai of the first sub-data circuit shown in FIG. 5. The gate electrode of Qn25 is connected to the node Nbi+1 of the second sub-data circuit shown in FIG. 5. The gate electrode of Qn26 is connected to the node Nai of the first sub-data circuit shown in FIG. 5. The gate electrode of Qn27 is connected to the node Nai+1 of the second sub-data circuit shown in FIG. 5. The gate electrode of Qn28 is connected to the node Nbi of the first sub-data circuit shown in FIG. 5. The gate electrode of Qn29 is connected to the node Nai+1 of the second sub-data circuit shown in FIG. 5. The gate electrode of Qn30 is connected to the node Nai of the first sub-data circuit shown in FIG. 5.

If DECB input to an inverter IV3 is at "L" level, and an output PT from inverters IV4 and IV5 is at "H" level, the control data of all the data memory circuits 10 are "0". If DECLB input to an inverter IV6 is at "L" level, and an output FR1 from an inverter IV7 is at "H" level, the control data of at least one data memory circuit 10 is "1". If DEC2B input to an inverter IV8 is at "L" level, and an output FR2 from an inverter IV9 is at "H" level, the control data of at least one data memory circuit 10 is "2". If DEC3B input to an inverter IV10 is at "L" level, and an output FR3 from an inverter IV11 is at "H" level, the control data of at least one data memory circuit 10 is "3".

The signals DECB, DEC1B, DEC2B, DEC3B are signals from the control signal/control voltage generator 7. The signals PT, FR1, FR2, and FR3 are fed back to the control signal/control voltage generator. The data detector 9 shown in FIG. 12 can detect data at once at a high speed. For this reason, the signal DEC3B is changed to "L" level to check the signal FR3 not upon the write shown in FIG. 8, but immediately before the verify read of data "3" (times t1 and t2 shown in FIG. 9). Similarly, the signal DEC2B is changed to "L" level to check the signal FR2 immediately before the verify read of data "2" (times t6 and t7 shown in FIG. 9). The signal DEC1B is changed to "L" level to check the signal FR1 immediately before the verify read of data "1" (times t10 and t11 shown in FIG. 9). The signal DECB is changed to "L" level to check the signal PT after the write verify shown in FIG. 9. With this processing, steps S13, S14, and S15 can be performed in one step. As a result, one wasteful write can be omitted, and data can be programmed at a higher speed.

Figure 13:
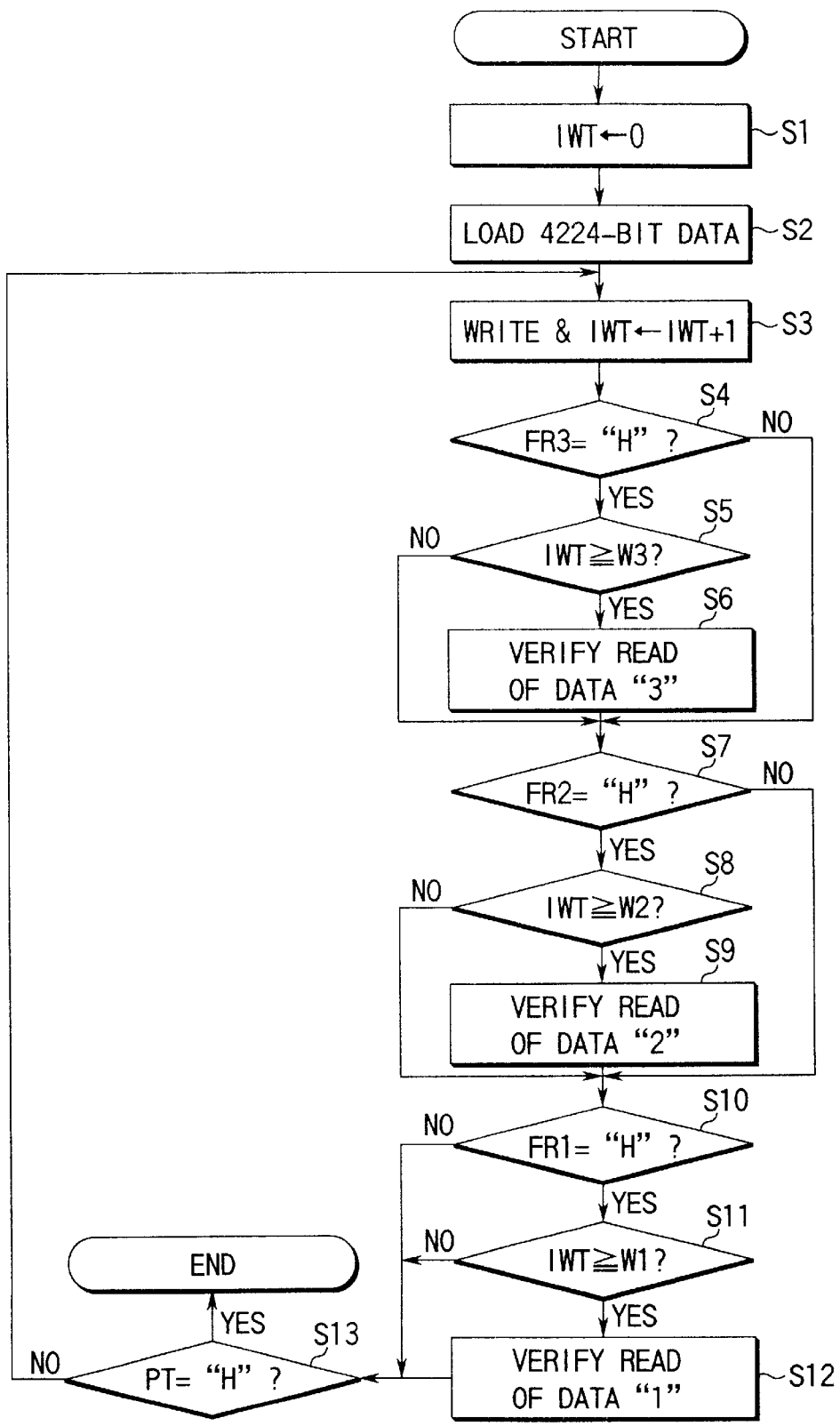
FIG. 13 is a flow chart showing memory cell programming (data write) using the arrangements in FIGS. 5 and 12.

FIG. 13 is a flow chart showing memory cell programming using the data memory circuit in FIG. 5 and the data detector in FIG. 12. Steps S4, S7, and S10 are executed by changing the signals DEC3B, DEC2B, and DEC1B to "L" level and checking the signals FR3, FR2, and FR1. Step S13 is executed by changing the signal DECB to "L" level and checking the signal PT. The remaining steps are the same as in the flow shown in FIG. 10.

Figure 14:
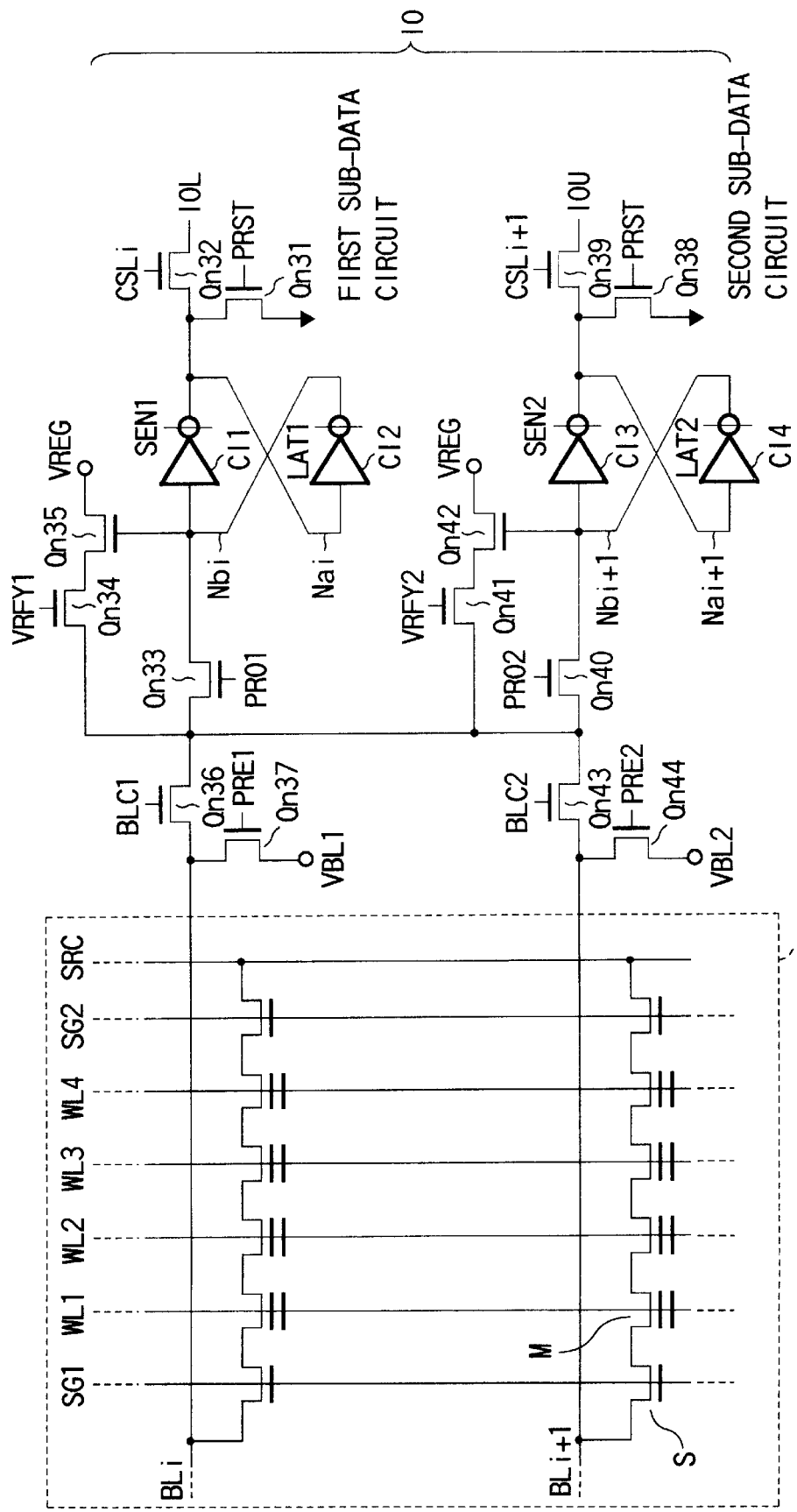
FIG. 14 is a circuit diagram showing the second example of the detailed arrangement of the data memory circuit connected to the memory cell array shown in FIG. 2.

FIG. 14 is a circuit diagram showing a modification of the detailed arrangement of the data memory circuit 10 shown in FIG. 5. The arrangement of a 4-valued storage EEPROM will be exemplified. The latch made up of clocked inverters CI1 and CI2 and n-channel MOS transistors Qn33, Qn34, and Qn35 constitute a first sub-data circuit. The latch made up of clocked inverters CI3 and CI4 and n-channel MOS transistors Qn40, Qn41, and Qn42 constitute a second sub-data circuit.

In write, first and second sub-data are respectively stored in the first and second sub-data circuits. In read, first and second read sub-data are respectively stored in the first and second sub-data circuits. When the node Nai in the first sub-data circuit is at "H" level, first read sub-data "1" or first sub-data "1" is stored in the first sub-data circuit. When the node Nai+1 in the second sub-data circuit is at "H" level, second read sub-data "1" or second sub-data "1" is stored in the second sub-data circuit. When the node Nai in the first sub-data circuit is at "L" level, first read sub-data "0" or first sub-data "0" is stored in the first sub-data circuit. When the node Nai+1 in the second sub-data circuit is at "L" level, second read sub-data "0" or second sub-data "0" is stored in the second sub-data circuit.

N-channel MOS transistors Qn32 and Qn39 are used to respectively electrically connect the first and second sub-data circuits to the data I/O lines IOL and IOU. The gate electrodes of the transistors Qn32 and Qn39 respectively receive outputs CSLi and CSLi+1 from the column decoder 3. For example, when CSLi changes to "H" level, the first sub-data circuit of the data memory circuit 10 connected to the bit lines BLi and BLi+1 is electrically connected to the data I/O line IOL. The data I/O lines IOL and IOU are connected to the data I/O buffer 4 in FIG. 1, and can set sub-data in the first or second sub-data circuit or can output read sub-data from the first or second sub-data circuit to the data I/O buffer 4.

N-channel MOS transistors Qn36 and Qn43 control electrical connection between the first and second sub-data circuits and the bit line BLi or BLi+1. If the signal BLC1 is at "H" level, and BLC2 is at "L" level, the first and second sub-data circuits are electrically connected to the bit line BLi. If the signal BLC1 is at "L" level, and BLC2 is at "H" level, the first and second sub-data circuits are electrically connected to the bit line BLi+1.

N-channel MOS transistors Qn37 and Qn44 control electrical connection between the bit line BLi and the voltage VBL1 and electrical connection between the bit line BLi+1 and the voltage VBL2. If the signal PRE1 is at "H" level, the bit line BLi is electrically connected to the voltage VBL1. If the signal PRE2 is at "H" level, the bit line BLi+1 is electrically connected to the voltage VBL2.

N-channel MOS transistors Qn31 and Qn38 are used to set sub-data "0" in the first and second sub-data circuits after the signal PRST changes to "H" level.

A signal representing the data or write state of the memory cell M is transferred via the bit line BLi or BLi+1. The clocked inverter CI1 in the first sub-data circuit and the clocked inverter CI3 in the second sub-data circuit also operate as sense amplifiers for sensing the logic level of the signal of the bit line BL. In this modification, the absolute value of the voltage of the bit line BL is sensed as logic level by the clocked inverter, but it may be sensed by a differential sense amplifier. In this case, the difference from the reference voltage is sensed as logic level.

Figure 15:
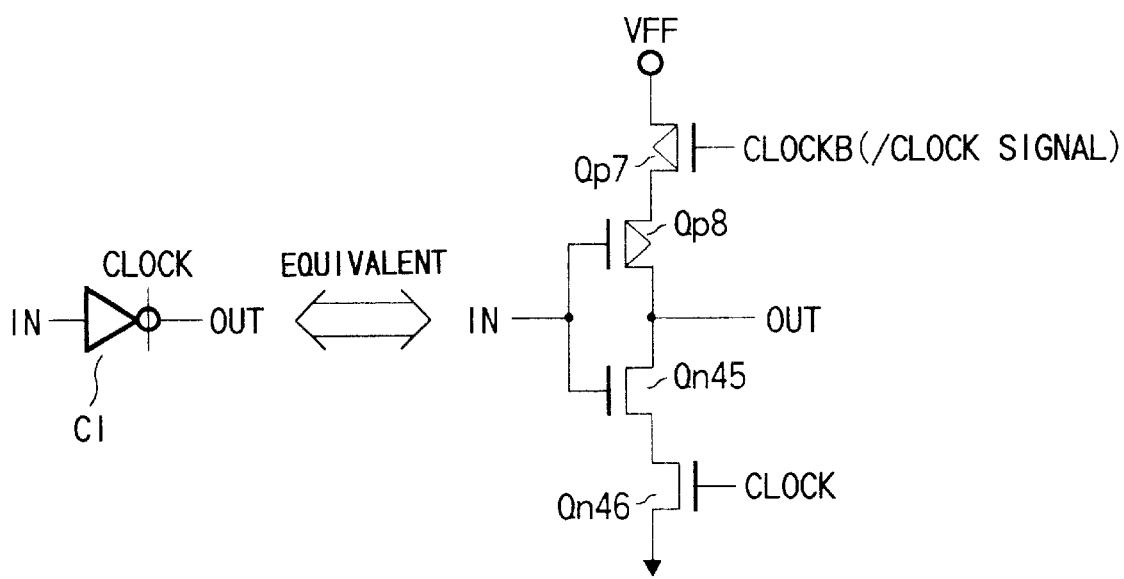
FIG. 15 is a circuit diagram showing the detailed arrangement of a clocked inverter in FIG. 14.

FIG. 15 is a circuit diagram showing the detailed arrangement of the clocked inverter CI. The inverter circuit made up of an n-channel MOS transistor Qn45 and a p-channel MOS transistor Qp8 has an input terminal IN and an output terminal OUT. An n-channel MOS transistor Qn46 and a p-channel MOS transistor Qp7 are arranged to activate and inactivate the inverter circuit by a signal CLOCK and an inverted signal CLOCKB. The inverter circuit is activated by an "H"-level signal CLOCK and an "L"-level signal CLOCKB and is inactivated by an "L"-level signal CLOCK and an "H"-level signal CLOCKB.

Signals SEN1, LAT1 SEN2, LAT2, PRO1, PRO2, BLC1, BLC2, PRE1, PRE2, VRFY1, VRFY2, and PRST and voltages VBL1, VBL2, VREG, and VFF in FIGS. 14 and 15 are output signals from the control signal/control voltage generator 7 in FIG. 1, and are common to all the data memory circuits 10 in FIG. 2. The voltage VCC is a power supply voltage, e.g., 3.3V.

Sub-data "0" or "1" is stored in the first and second sub-data circuits. The first and second sub-data circuits change stored sub-data "1" to sub-data "0" in response to an "H"-level bit line signal, and hold sub-data "0". Regardless of the detailed circuit arrangement, the present invention can be practiced using various circuits having the above functions.

In the sub-data circuit in FIG. 14, before the signal PRO1 or PRO2 changes to "H" level to sense the voltage level of the bit line BL by the clocked inverter CI1 or CI3, the voltage level of the bit line BL is adjusted by the n-channel MOS transistors Qn34 and Qn35 or Qn41 and Qn42 in accordance with the first or second sub-data. Only when the first or second sub-data is "0", the voltage level of the bit line BL is adjusted to "H" level. When the signal PRO1 or PRO2 changes to "H" level, and an "H"-level signal of the bit line is transferred to the input terminal of the clocked inverter CI1 or CI3, the node Nai or Nai+1 changes to "L" level.

Then, sub-data "0" is stored by the clocked inverter CI2 or CI4. Therefore, originally stored sub-data "0" is not changed. For an "H"-level bit line BL, originally stored sub-data "1" is changed to sub-data "0", and the sub-data "0" is stored. For an "L"-level bit line BL, sub-data "1" is held.

Figure 16:
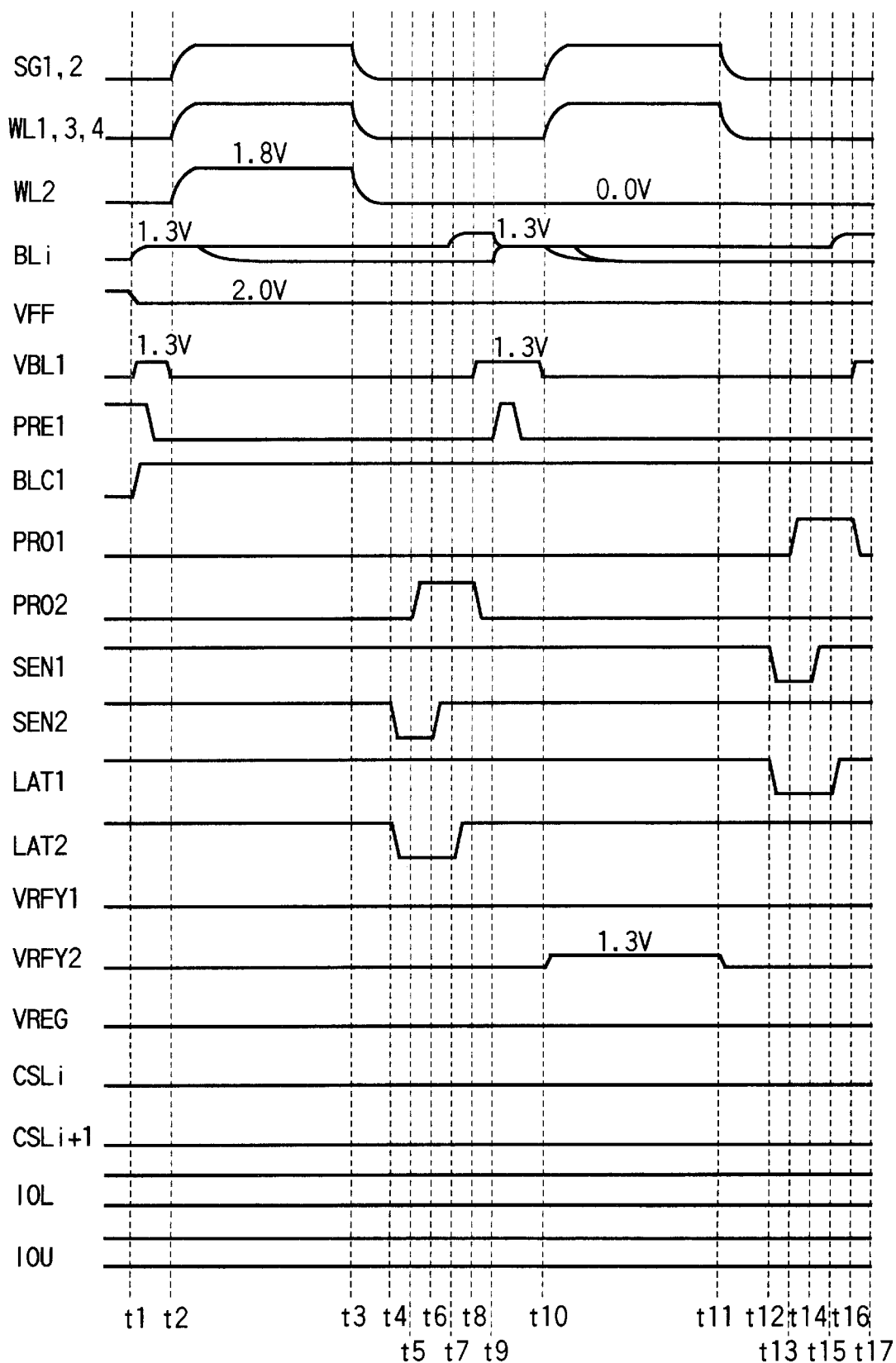
FIG. 16 is a waveform chart showing the read of 4-valued data stored in the memory cell and showing a change in voltage at each portion in FIG. 14.
Figure 17:
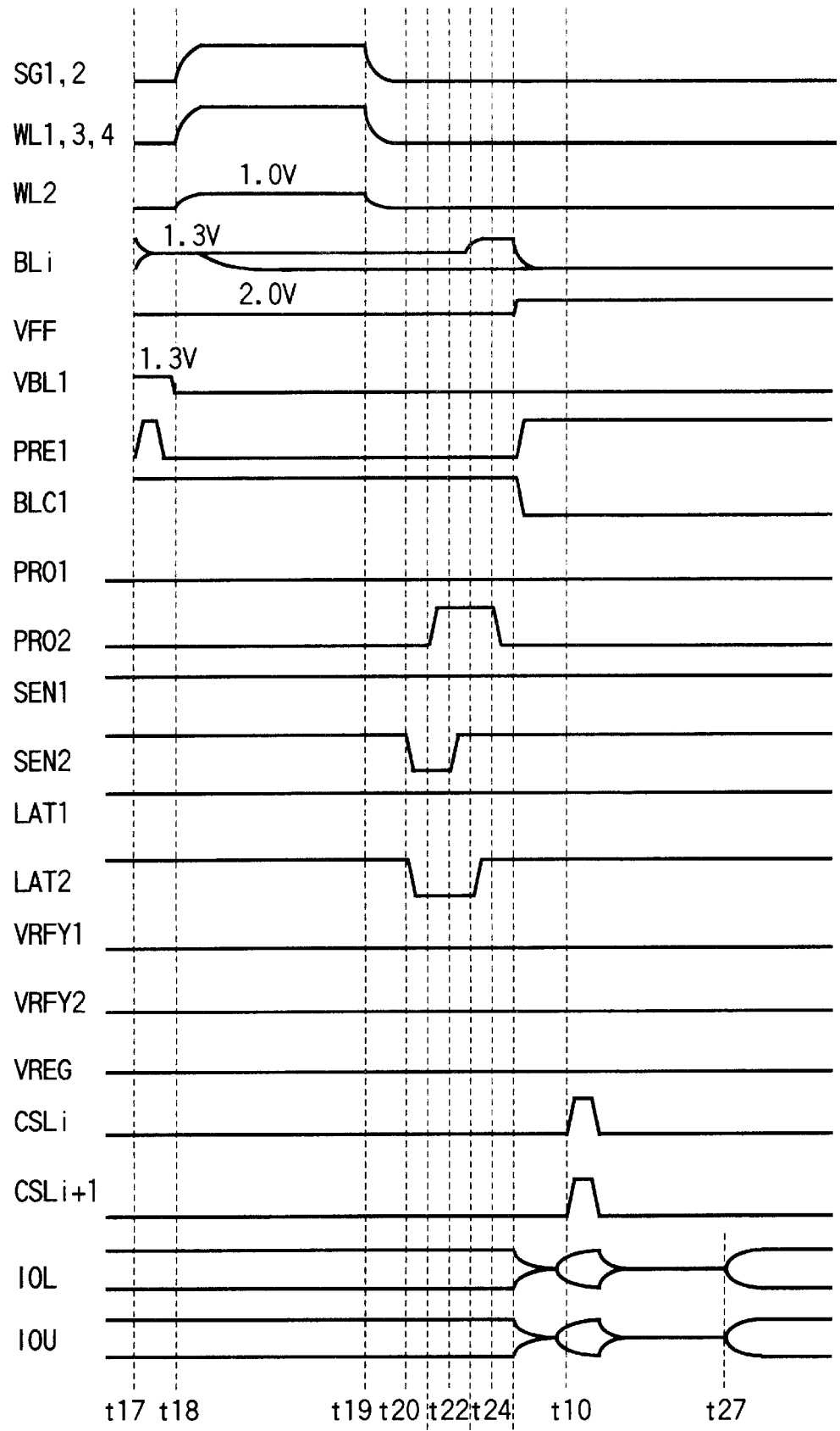
FIG. 17 is a waveform chart, subsequent to FIG. 16, showing the read of 4-valued data stored in the memory cell and showing a change in voltage at each portion in FIG. 14.

FIGS. 16 and 17 are waveform charts, respectively showing the read of 4-valued data stored in the memory cell and showing a change in voltage at each portion in FIG. 14. FIGS. 16 and 17 show the case wherein the bit lines BL0, BL2, . . . , BLi, . . . , BL4222 are selected (BLi is shown as a representative), and the word line WL2 is selected. In this case, 4-valued storage is exemplified, but 3-valued storage can be easily implemented by limiting the number of storage levels to three. Since the voltage VGL2 remains 0V, BLC2 is kept at "L" level, PRE2 is kept at "H" level, PRST is kept at "L" level, and the bit line BLi+1 is kept at 0V, they are not illustrated in the waveform charts (FIGS. 16 and 17).

First, the voltage VBL1 rises to 1.3V to charge the bit line BLi to "H" level (t1). The signal BLCL changes to "H" to select the bit line BLi (t1). The voltage VFF (see FIG. 15) is fixed at 2V in order to stabilize the sense sensitivities of the clocked inverters CI1 and CI3 operating as sense amplifiers.

The signal PRE1 changes to "L" level to electrically disconnect the bit line BLi from the voltage VBL1. The selection gates SG1 and SG2 and the non-selected word lines WL1, WL3, and WL4 in the selected block increase in voltage to 3V, while the selected word line WL2 increases in voltage to 1.8V (t2).

Table 5 shows the relationship between data stored in the memory cell M and the threshold voltage.

TABLE 5

| Data Stored in Memory Cell | Threshold Voltage of Memory Cell |
| --- | --- |
| 0 | 0 V or less |
| 1 | between 0.4 V and 0.8 V |
| 2 | between 1.2 V and 1.6 V |
| 3 | between 2.0 V and 2.4 V |

After the voltage of the selected word line WL2 reaches 1.8V, the bit line BLi maintains "H" level only when data "3" is stored in the memory cell. Otherwise, the bit line BLi changes to "L" level. The selection gates SG1 and SG2 and the word lines WL1 to WL4 are reset to 0V (t3), and then the signals SEN2 and LAT2 change to "L" level to inactivate the clocked inverters CI3 and CI4 (t4).

When the signal PRO2 changes to "H" level (t5), and the signal SEN2 changes to "H" level (t6), the clocked inverter CI3 is activated to sense the voltage of the bit line BLi. When the signal LAT2 changes to "H" level (t7), the clocked inverter CI4 is activated to latch the sensed logic level of the signal of the bit line BLi. The signal PRO2 changes to "L" level (t8) to complete the operation of detecting whether the threshold voltage of the memory cell M is 1.8V or more. Only when data "3" is stored in the memory cell, the first read sub-data in the second sub-data circuit is "0". Otherwise, the second read sub-data is "1".

Subsequently, whether the threshold voltage of the memory cell M is 0.0V or more is detected. When the voltage VBL1 rises to 1.3V (t8), and the signal PRE1 changes to "H" level, the bit line BLi is charged to "H" level (t9). The signal PRE1 changes to "L" level to electrically disconnect the bit line BLi from the voltage VBL1. The selection gates SG1 and SG2 and the non-selected word lines WL1, WL3, and WL4 in the selected block increases in voltage to 3V, while the selected word line WL2 is kept at 0.0V (t10). At the same time, the signal VRFY2 increases to 1.3V to turn on the n-channel MOS transistor Qn41. Only when the second read sub-data is "0", the voltage of the bit line BLi changes to "L" level by the n-channel MOS transistors Qn41 and Qn42 (t10 and t11).

After the selected word line WL2 is at 0.0V, the bit line BLi maintains "H" level only when data "1" or "2" is stored in the memory cell. Otherwise, the bit line BLi changes to "L" level. The selection gates SG1 and SG2 and the word lines WL1 to WL4 are reset to 0V (t11), and then the signals SEN1 and LAT1 change to "L" level to inactivate the clocked inverters CI1 and CI2 (t12). When the signal PRO1 changes to "HH" level (t13), and the signal SEN1 changes to "H" level (t14), the clocked inverter CI1 is activated to sense the voltage of the bit line BLi. When the signal LAT1 changes to "H" level (t15), the clocked inverter CI2 is activated to latch the sensed logic level of the signal of the bit line BLi. The signal PRO1 changes to "L" level (t16) to complete the operation of detecting whether the threshold voltage of the memory cell M is 0.0V or more. Only when data "1" or "2" is stored in the memory cell, the first read sub-data in the first sub-data circuit is "0". Otherwise, the first read sub-data is "1".

Subsequently, whether the threshold voltage of the memory cell M is 1.0V or more is detected. When the voltage VBL1 rises to 1.3V (t16), and the signal PRE1 changes to "H" level, the bit line BLi is charged to "H" level (t17 in FIG. 17). The signal PRE1 changes to "L" level (t17) to electrically disconnect the bit line BLi from the voltage VBL1. The selection gates SG1 and SG2 and the non-selected word lines WL1, WL3, and WL4 in the selected block increase in voltage to 3V, while the selected word line WL2 increases in voltage to 1.0V (t18).

After the selected word line WL2 reaches 1.0V, the bit line BLi maintains "H" level only when data "3" or "2" is stored in the memory cell. Otherwise, the bit line BLi changes to "L" level. The selection gates SG1 and SG2 and the word lines WL1 to WL4 are reset to 0V (t19), and then the signals SEN2 and LAT2 change to "L" level to inactivate the clocked inverters CI3 and CI4 (t20). When the signal PRO2 changes to "H" level (t21), and the signal SEN2 changes to "H" level (t22), the clocked inverter CI3 is activated to sense the voltage of the bit line BLi. When the signal LAT2 changes to "H" level (t23), the clocked inverter CI4 is activated to latch the sensed logic level of the signal of the bit line BLi. The signal PRO2 changes to "L" level (t24) to complete the operation of detecting whether the threshold voltage of the memory cell M is 1.0V or more. Only when data "3" or "2" is stored in the memory cell, the second read sub-data in the second sub-data circuit is "0". Otherwise, the second read sub-data is "1".

The signal BLC1 changes to "L" level, the signal PRE1 changes to "H" level, and the voltage VFF rises to VCC to complete the operation of storing the data of the memory cell M as read data in the data memory circuit 10.

When the signals CSLi and CSLi+1 change to "H" level (t26), the first read sub-data is output to the data I/O line IOL, and the second read sub-data is output to the data I/O line IOU. The first and second read sub-data are output to the outside from the I/O terminal 5 via the data I/O buffer 4.

Table 6 shows the relationship between 4-valued data and the first and second read sub-data in the memory cell.

TABLE 6

| Data stored in Memory Cell | First Read Sub-Data | Second Read Sub-Data |
|---|---|---|
| 0 | 1 | 1 |
| 1 | 0 | 1 |
| 2 | 0 | 0 |
| 3 | 1 | 0 |

Figure 18:
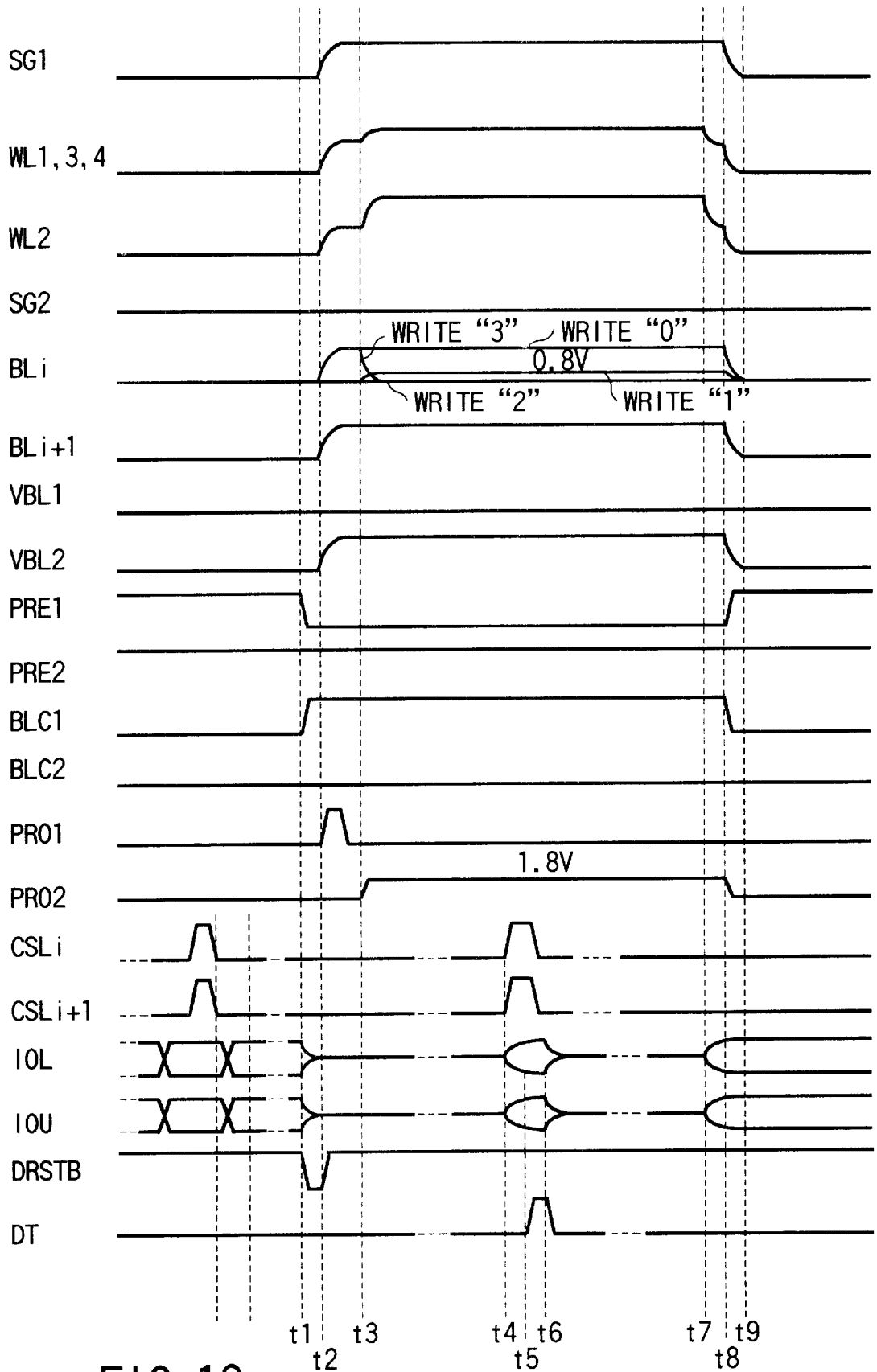
FIG. 18 is a waveform chart showing the initial setting and write of control data in the data memory circuit in FIG. 14 and showing a change in voltage at each portion in FIGS. 14 and 6.

FIG. 18 is a waveform chart showing the initial setting and write of control data in the data memory circuit 10 and showing a change in voltage at each portion in FIGS. 14 and 6. FIG. 18 shows the case wherein the bit lines BL0, BL2, . . . , BLi, . . . , BL4222 are selected (BLi is shown as a representative), and the word line WL2 is selected. In this case, 4-valued storage is exemplified, but 3-valued storage can be easily implemented by limiting the number of storage levels to three.

The initial setting of control data in the data memory circuit 10 connected to the bit line BLi is performed as follows. Initial sub-data for the first sub-data circuit is transferred to the data I/O line IOL, initial sub-data for the second sub-data circuit is transferred to the data I/O line IOU to change the signal CSLi+1 to "H" level and store the initial sub-data in the first and second sub-data circuits. Another signal CSL is selected to set initial control data in an arbitrary number of data memory circuits 10. Table 7 shows the relationship between the initial control data and the initial sub-data in this case.

TABLE 7

| Initial Control Data | Initial Sub-Data of First Sub-Data Circuit | Initial Sub-Data of Second Sub-Data Circuit |
|---|---|---|
| 0 | 0 | 0 |
| 1 | 1 | 0 |
| 2 | 1 | 1 |
| 3 | 0 | 1 |

It is desirable to change the signal PRST to "H" level and reset the control data of all the data memory circuits 10 to "0" before setting all the initial control data. As will be described later, since the state of the memory cell M is not changed by control data "0", the initial control data is externally set in only desired data memory circuits of 2,112 data memory circuits 10. As a matter of course, the initial control data can be externally set in all the 2,112 data memory circuits 10. Since the signal SEN1 is kept at "H" level, LAT1 is kept at "H", level, VRFY1 is kept at "L" level, SEN2 is kept at "H" level, LAT2 is kept at "H" level, VRFY2 is kept at "L" level, the voltage VREG remains 0V, and VFF remains VCC, they are not illustrated in FIG. 18.

In a write, the signal PRE1 changes to "L" level to electrically disconnect the bit line BLi from the voltage VBL1 (t1). At the same time, the signal BLC1 changes to "H" level to select the bit line BLi (t1). The signal DRSTB changes to "L" level to reset the data detector 9 (t1 and t2).

The voltage VBL2 rises to VCC to charge the non-selected bit line BLi+1 to VCC via the n-channel MOS transistor Qn44 (t2 and t3). The PRO1 changes to "H" level to charge the selected bit line BLi in accordance with the first sub-data (t2 and t3). At this time, the bit line BLi is charged to VCC when the control data is "0" or "3", and to 0V when the control data is "1" or "2". The selection gate SG1 and the word lines WL1 to WL4 increase in voltage to VCC (t2 and t3).

The selection gate SG2 is kept at 0V. Thereafter, the signal PRO2 increases in voltage to 1.8V to change the voltage of the bit line BLi in accordance with the second sub-data (t3). When the second sub-data is "0", a bit line BLi at 0V is charged to 0.8V lower than 1.8V by the threshold voltage (e.g., 1V) of the n-channel MOS transistor Qn40. When the second sub-data is "0", a bit line BLi at VCC is kept at VCC because the n-channel MOS transistor Qn40 is kept off. When the second sub-data is "1", the bit line BL is at 0V because the n-channel MOS transistor Qn40 is kept on.

As a result, the bit line BLi is at VCC for control data "0", at 0.8V for control data "1", at 0V for control data "2", and at 0V for control data "3". The selected word line WL2 increases in voltage to 20V, the non-selected word line increases in voltage to 10V, and electron injection into the floating gate of the memory cell starts in accordance with the control data (t3 to t7). When the bit line BL is at 0V, electron injection occurs at a voltage difference of 20V between the memory cell channel and the word line. When the bit line BL is at 0.8V, electron injection occurs at a voltage difference of 19.2V between the memory cell channel and the word line, but the number of electrons is smaller than that for a voltage difference of 20V between the memory cell channel and the word line. When the bit line BL is at VCC, the memory cell channel is boosted by capacitive coupling of the word lines WL1 to WL4, and no electron injection substantially occurs due to a small voltage difference between the memory cell channel and the word line.

While the selected word line WL2 is kept at 20V (t3 to t7), control data stored in the data memory circuit 10 is detected. The column decoder 3 sequentially selects CSL0, CSL1, . . . , CSL4222, and CSL4223, and control data is transferred to the data detector 9 via the data I/O lines IOL and IOU. FIG. 17 shows the case wherein CSLi and CSLi+1 are selected. CSLi and CSLi+1 change to "H" level (t4) to output the control data to the data I/O lines IOL and IOU. The signal DT changes to "H" level to detect the control data by the data detector 9 (t5 and t6).

At this time, if data "1" is stored in even one data memory circuit 10, the signal FR1 changes to "H" level. If data "2" is stored in even one data memory circuit 10, the signal FR2 changes to "H" level. If data "3" is stored in even one data memory circuit 10, the signal FR3 changes to "H" level.

After the word lines WL1 to WL4 decrease in voltage to VCC (t7 and t8), the voltage VBL2 decreases to 0V, and the signal PRE1 changes to "H" level to reset the bit lines BLi and BLi+1 to 0V (t8 and t9). The voltage VBL1 remains 0V. The word lines WL1 to WL4 are also reset to 0V (t8 and t9).

Figure 19:
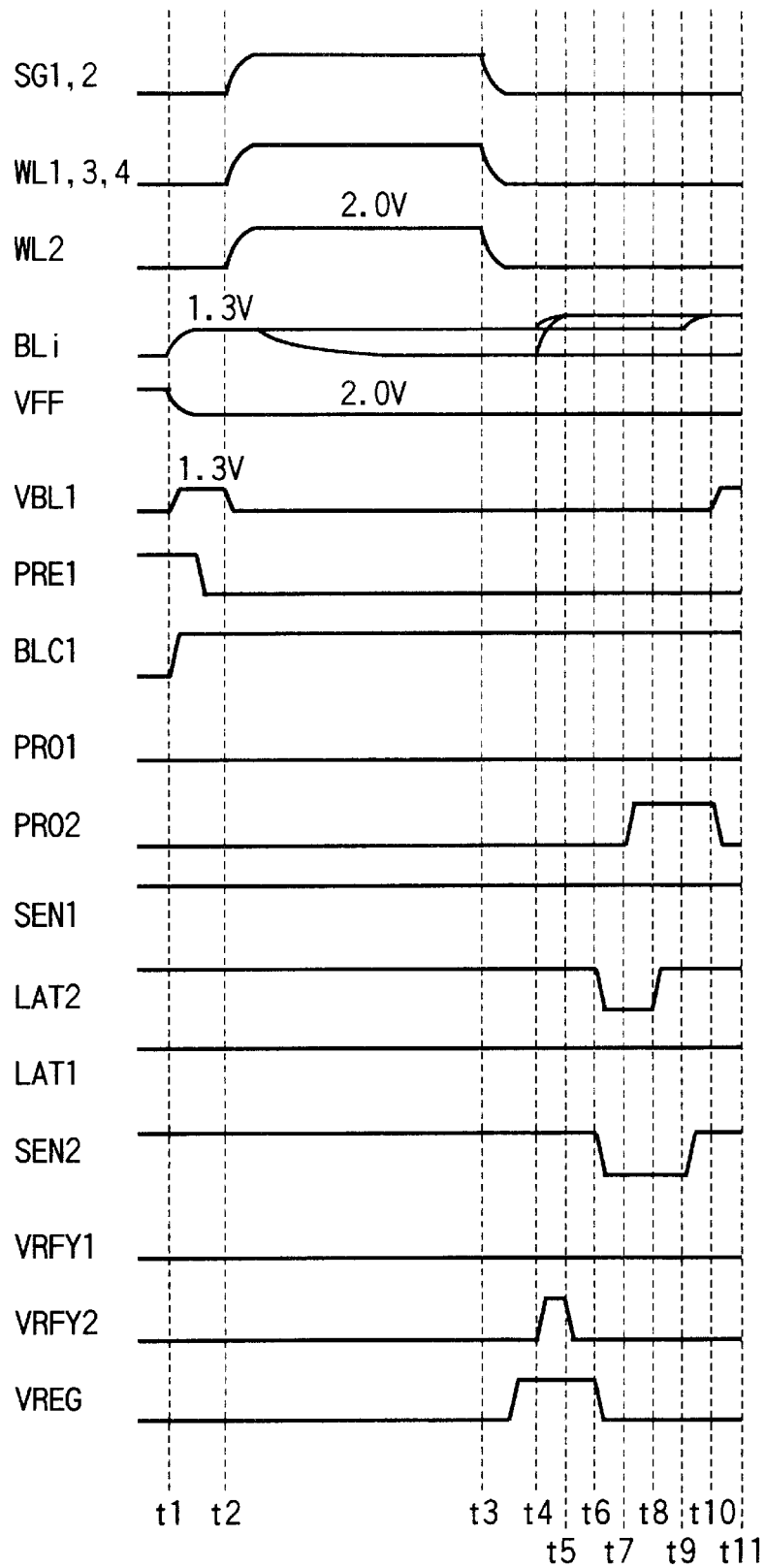
FIG. 19 is a waveform chart showing a write verify for detecting the write state of the memory cell after a write at times t1 to t9 shown in FIG. 18.
Figure 20:
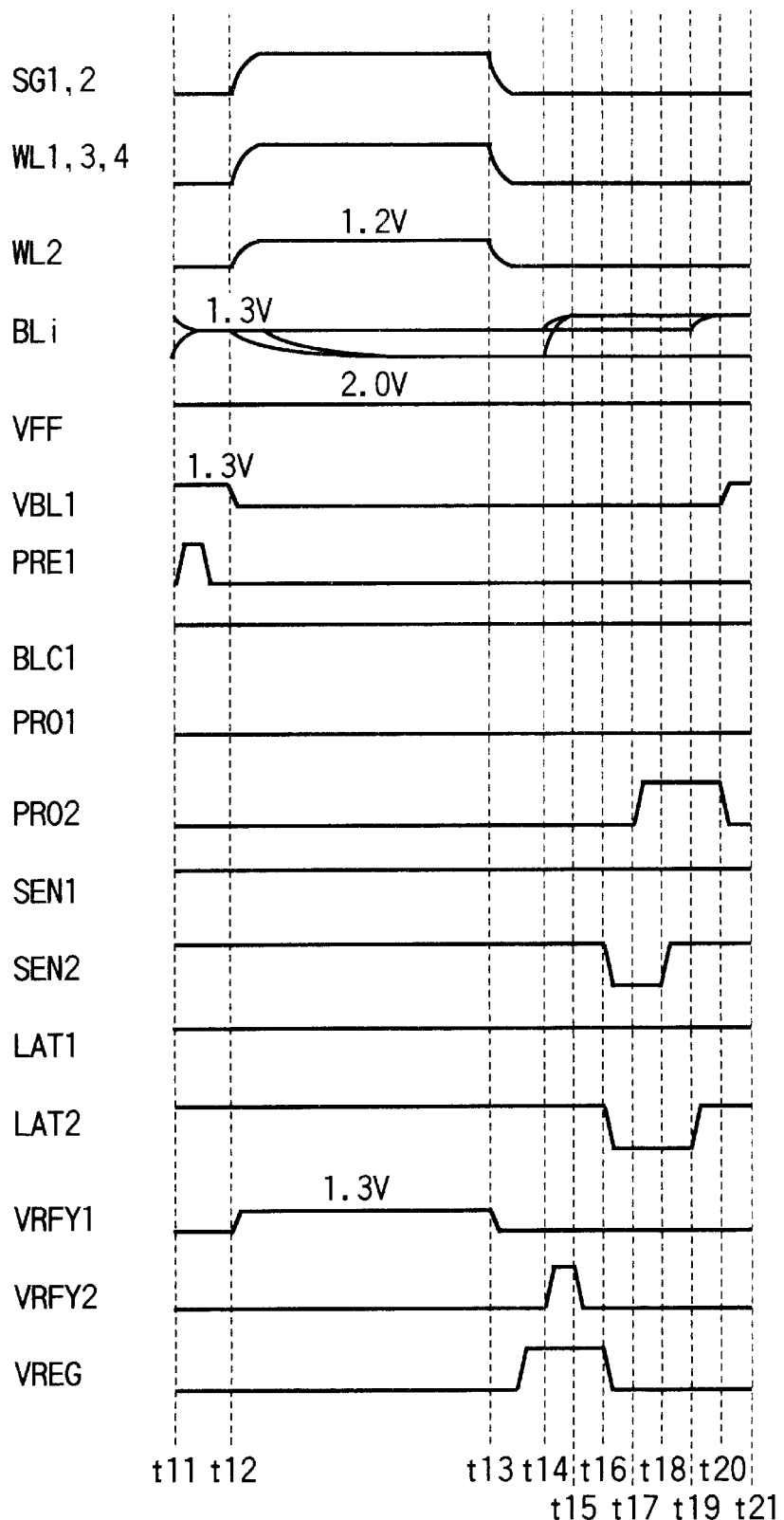
FIG. 20 is a waveform chart, subsequent to FIG. 19, showing the write verify for detecting the write state of the memory cell after the write at times t1 to t9 shown in FIG. 18.
Figure 21:
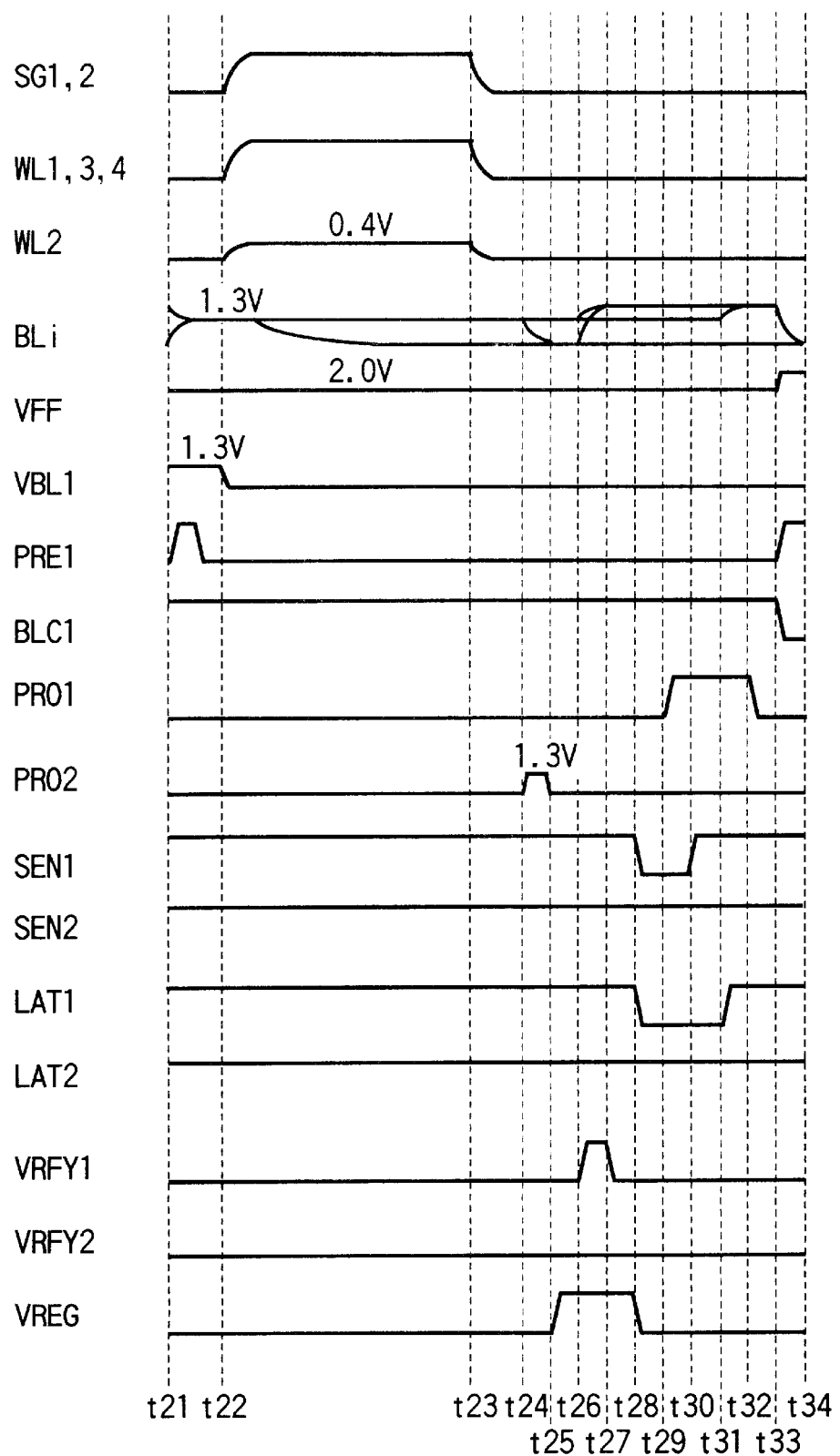
FIG. 21 is a waveform chart, subsequent to FIG. 20, showing the write verify for detecting the write state of the memory cell after the write at times t1 to t9 shown in FIG. 18.

FIGS. 19 to 21 are waveform charts, respectively, showing a write verify for detecting the write state of the memory cell after a write at times t1 to t9 shown in FIG. 18. FIGS. 19 to 21 show the case wherein the bit lines BL0, BL2, . . . , BLi, . . . , BL4222 are selected (BLi is shown as a representative), and the word line WL2 is selected. Since the voltage VBL2 in FIG. 14 remains 0V, BLC2 is kept at "L" level, PRE2 is kept at "H" level, and the bit line BLi+1 is kept at 0V, they are not illustrated in these waveform charts. Since the signal PRST is kept at "L" level, CSLi is kept at "L" level, and CSLi+1 is kept at "L" level, they are not illustrated in these waveform charts.

The voltage VBL1 rises to 1.3V to charge the bit line BLi to "H" level (t1). The signal BLC1 changes to "H" level to select the bit line BLi (t1). The voltage VFF (see FIG. 15) is fixed at 2.0V. The signal PRE1 changes to "L" level to electrically disconnect the bit line BLi from the voltage VBL1. The selection gates SG1 and SG2 and the non-selected word lines WL1, WL3, and WL4 in the selected block increase in voltage to 3V, while the selected word line WL2 increases in voltage to 2.0V (t2).

After the voltage of the selected word line WL2 reaches 2.0V, if data "3" is stored in a memory cell corresponding to a data memory circuit in which control data "3" is stored, a corresponding bit line BLi maintains "H" level. Otherwise, a corresponding bit line BLi changes to "L" level. Since no data "3" is stored in a memory cell corresponding to a data memory circuit in which control data "2" or "1" is stored, a corresponding bit line BLi changes to "L" level.

After the selection gates SG1 and SG2 and the word lines WL1 to WL4 are reset to 0V (t3), the signal VRFY2 changes to "H" level. Only when the second sub-data is "0", the bit line BLi changes to "H" level (t4). At this time, the voltage VREG rises to VCC. The signals SEN2 and LAT2 change to "L" level to inactivate the clocked inverters CI3 and CI4 (t6). When the signal PRO2 changes to "H" level (t7), and the signal SEN2 changes to "H" level (t8), the clocked inverter CI3 is activated to sense the voltage of the bit line BLi. When the signal LAT2 changes to "H" level (t9), the clocked inverter CI4 is activated to latch the sensed logic level of the signal of the bit line BLi. The signal PRO2 changes to "L" level (t10) to complete the operation (verify read of data "3") of detecting whether data "3" is stored in a memory cell corresponding to a data memory circuit in which control data "3" is stored. Only when it is detected that data "3" is stored in a memory cell corresponding to a data memory circuit in which control data "3" is stored, the control data of the data memory circuit in which control data "3" is stored is changed to data "0". Otherwise, the control data is held (not changed).

Subsequently, it is detected whether data "2" is stored in a memory cell corresponding to a data memory circuit in which control data "2" is stored. The voltage VBL1 rises to 1.3V (t10), and the signal PRE1 changes to "H" level to charge the bit line BLi to "H" level (t11 in FIG. 20).

The signal PRE1 changes to "L" level to electrically disconnect the bit line BLi from the voltage VBL1. The selection gates SG1 and SG2 and the non-selected word lines WL1, WL3, and WL4 in the selected block increase in voltage to 3V, while the selected word line WL2 increases in voltage to 1.2V (t12). At the same time, the signal VRFY1 increases to 1.3V to turn on the n-channel MOS transistor Qn34. Accordingly, only when the first sub-data is "0", the voltage of the bit line BLi changes to "L" level by the n-channel MOS transistors Qn34 and Qn35 (t12 and t13).

After the voltage of the selected word line WL2 reaches 1.2V, if data "2" is stored in a memory cell corresponding to a data memory circuit in which control data "2" is stored, a corresponding bit line BLi maintains "H" level. Otherwise, a corresponding bit line BLi changes to "L" level. Since no data "2" is stored in a memory cell corresponding to a data memory circuit in which control data "1" is stored, a corresponding bit line BLi changes to "L" level.

After the selection gates SG1 and SG2 and the word lines WL1 to WL4 are reset to 0V (t13), the signal VRFY2 changes to "H" level. Only when the second sub-data is "0", the bit line BLi changes to "H" level (t14). At this time, the voltage VREG rises to VCC. The signals SEN2 and LAT2 change to "L" level to inactivate the clocked inverters CI3 and CI4 (t16). When the signal PRO2 changes to "H" level (t17), and the signal SEN2 changes to "H" level (t18), the clocked inverter CI3 is activated to sense the voltage of the bit line BLi. When the signal LAT2 changes to "H" level (t19), the clocked inverter CI4 is activated to latch the sensed logic level of the signal of the bit line BLi. The signal PRO2 changes to "L" level (t20) to complete the operation (verify read of data "2") of detecting whether data "2" is stored in a memory cell corresponding to a data memory circuit in which control data "2" is stored.

Only when it is detected that data "3" is stored in a memory cell corresponding to a data memory circuit in which control data "3" is stored, the control data of the data memory circuit 10 is changed to data "0". Only when it is detected that data "2" is stored in a memory cell corresponding to a data memory circuit in which control data "2" is stored, the control data of the data memory circuit 10 is changed to data "1". Otherwise, the control data is held (not changed).

After that, it is detected whether data "1" is stored in a memory cell corresponding to a data memory circuit in which control data "1" is stored. The voltage VBL1 rises to 1.3V (t20), and the signal PRE1 changes to "H" level to charge the bit line BLi to "H" level (t21 in FIG. 21).

The signal PRE1 changes to "L" level to electrically disconnect the bit line BLi from the voltage VBL1. The selection gates SG1 and SG2 and the non-selected word lines WL1, WL3, and WL4 in the selected block increase in voltage to 3V, while the selected word line WL2 increases in voltage to 0.4V (t22).

After the voltage of the selected word line WL2 reaches 0.4V, if data "1" is stored in a memory cell corresponding to a data memory circuit in which control data "1" is stored, a corresponding bit line BLi maintains "H" level. Otherwise, a corresponding bit line BLi changes to "L" level. After the selection gates SG1 and SG2 and the word lines WL1 to WL4 are reset to 0V (t23), the signal PRO2 increases to 1.3V (t24). When the second sub-data is "1", the bit line BLi changes to "L" level. When the second sub-data is "0", and the bit line BLi is originally at "H" level, the bit line BLi maintains "H" level. When the second sub-data is "0", and the bit line BLi is originally at "L" level, the bit line BLi increases in voltage to 0.3V at most by the 1.3-V signal PRO2 if the threshold voltage of the n-channel MOS transistor Qn40 is 1V. The bit line BLi can maintain "L" level by setting the clocked inverter CI1 so as to detect the voltage of the 0.3-V bit line BLi as "L" level.

The signal VRFY1 changes to "H" level. Only when the first sub-data is "0", the bit line BLi changes to "H" level (t26). The signals SEN1 and LAT1 change to "L" level to inactivate the clocked inverters CI1 and CI2 (t28). When the signal PRO1 changes to "H" level (t29), and the signal SEN1 changes to "H" level (t30), the clocked inverter CI1 is activated to sense the voltage of the bit line BLi. When the signal LAT1 changes to "H" level (t31), the clocked inverter CI2 is activated to latch the sensed logic level of the signal of the bit line BLi.

The signal PRO1 changes to "L" level (t32) to complete the operation (verify read of data "1") of detecting whether data "1" is stored in a memory cell corresponding to a data memory circuit in which control data "1" is stored. The control data of the data memory circuit 10 is changed to data "0" only when it is detected that data "3" is stored in a memory cell corresponding to a data memory circuit in which control data "3" is stored, it is detected that data "2" is stored in a memory cell corresponding to a data memory circuit in which control data "2" is stored, or it is detected that data "1" is stored in a memory cell corresponding to a data memory circuit in which control data "1" is stored. Otherwise, the control data is held (not changed).

The signals BLC1 and PRE1 respectively change to "L" and "H" levels, and the voltage VFF changes to VCC, thereby completing write verify. Write verify changes the control data stored in the data memory circuit 10 from the write state of the memory cell to the state shown in Table 8.

TABLE 8

| Write State of Memory Cell | Control Data before Write Verify | Control Data after Write Verify |
| --- | --- | --- |
| 0, 1, 2, or 3 | 0 | 0 |
| Smaller than 1 | 1 | 1 |
| 1 | 1 | 0 |
| Smaller than 2 | 2 | 2 |
| 2 | 2 | 0 |
| Smaller than 3 | 3 | 3 |
| 3 | 3 | 0 |

The verify read of data "3", the verify read of data "2", and the verify read of data "1" shown in FIGS. 19 to 21 are selectively executed as follows:

(1) All the verify read of data "3", verify read of data "2", and verify read of data "1" are executed by the operation shown in FIGS. 19 to 21.

(2) Only the verify read of data "3" and verify read of data "2" are executed by the operation shown in FIGS. 19 to 21.

(3) Only the verify read of data "3" and verify read of data "1" are executed by the operation shown in FIGS. 19 to 21 except for the operation from time t11 to t21.

(4) Only the verify read of data "3" is executed by the operation shown in FIGS. 19 to 21 except for the operation from time t11 to t34. Note that, at t11, the voltage VBL1 is set at 0V, VFF is set at VCC, the signal PRE1 is reset to "H" level, and BLC1 is reset to "L" level.

(5) Only the verify read of data "2" and verify read of data "1" are executed by the operation shown in FIGS. 19 to 21 except for the operation from time t1 to t11. Note that, at t11, the voltage VBL1 is set at 1.3V, VFF is set at 2.0V, and BLC1 is set at "H" level.

(6) Only the verify read of data "2" is executed by the operation shown in FIGS. 19 to 21 except for the operations from time t1 to t11. Note that, at t11, the voltage VBL1 is set at 1.3V, VFF is set at 2.0V, and BLC1 is set at "H" level.

(7) Only the verify read of data "1" is executed by the operation shown in FIGS. 19 to 21 except for the operation from time t1 to t21. Note that, at t21, the voltage VBL1 is set at 1.3V, VFF is set at 2.0V, and BLC1 is set at "H" level.

A write from t1 to t9 shown in FIG. 18 and a write verify shown in FIGS. 19 to 21 are repeatedly performed to write (program) data in the memory cell M until all control data become "0".

Figure 22:
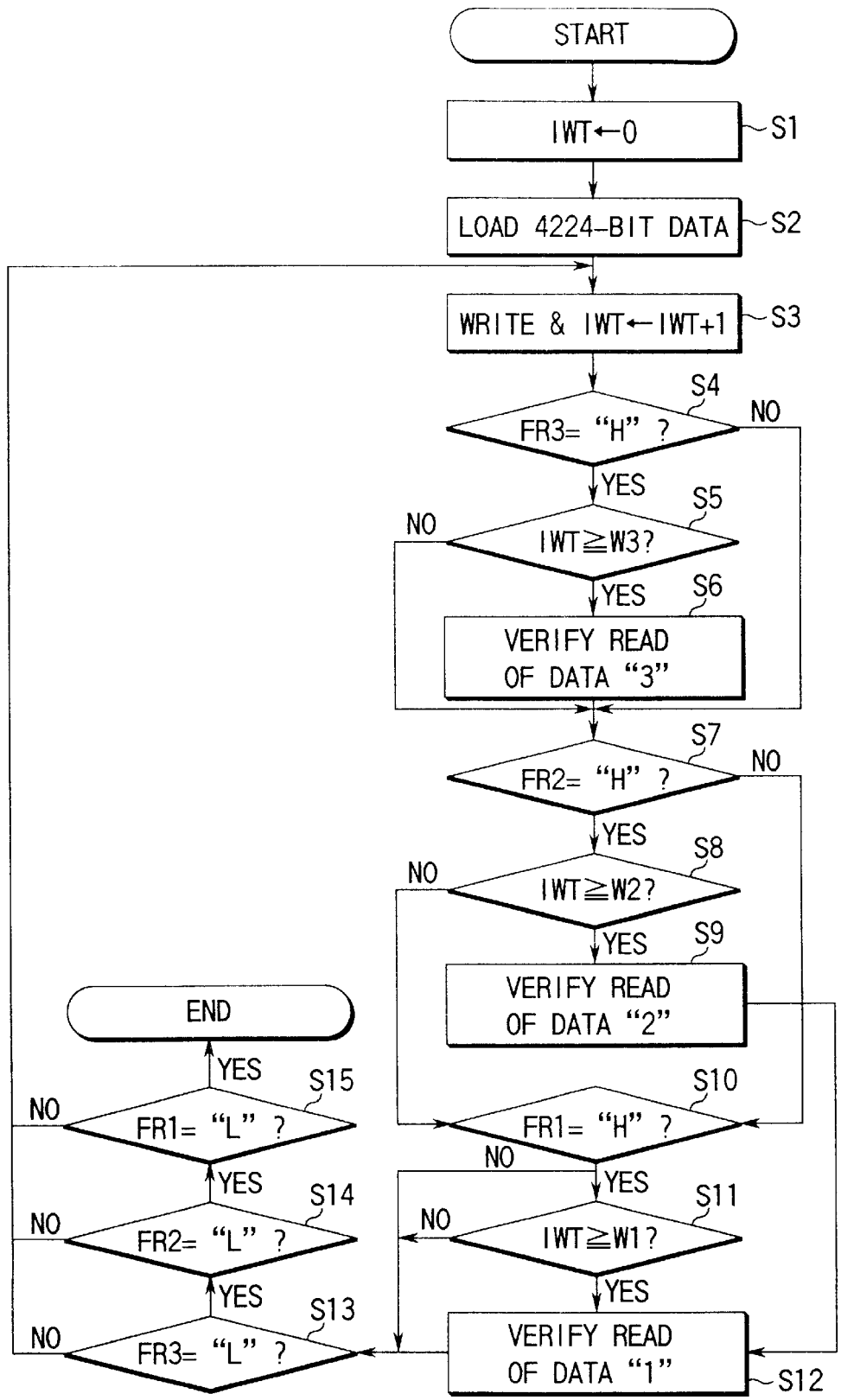
FIG. 22 is a flow chart showing detailed memory cell programming (data write) using the arrangements in FIGS. 14 and 6.

FIG. 22 is a flow chart showing detailed memory cell programming using the data memory circuit in FIG. 14 and the data detector in FIG. 6. This programming flow is controlled by the control signal/control voltage generator 7 shown in FIG. 1. The programming starts by a programming start command input to the control signal input terminal 8. A counter which is arranged in the control signal/control voltage generator 7 and counts the variable IWT is reset to set IWT at 0 (S1). Initial control data corresponding to 4,224 bits which is input to the I/O terminal 5 is loaded to the data memory circuit 10 (S2).

After loading, the data is written. At this time, the variable IWT is incremented by one (S3). Whether the output FR3 from the data detector 9 is at "H" level is checked (S4). If the output FR3 from the data detector 9 is at "H" level, and data "3" is left in the data memory circuit 10, whether the variable IWT is predetermined W3 or more is checked (S5). If YES in S5, verify read of data "3" is performed (S6). If FR3 is at "L" level, or the variable IWT is smaller than W3, the verify read of data "3" is skipped.

Whether the output FR2 from the data detector 9 is at "H" level is checked (S7). If the output FR2 from the data detector 9 is at "H" level, and data "2" is left in the data memory circuit 10, whether the variable IWT is predetermined W2 or more is checked (S8). If YES in S8, the verify read of data "2" is performed (S9). If FR2 is at "L" level, or the variable IWT is smaller than W2, the verify read of data "2" is skipped.

Whether the output FR1 from the data detector 9 is at "H" level is checked (S10). If the output FR1 from the data detector 9 is at "H" level, and data "1" is left in the data memory circuit 10, whether the variable IWT is predetermined W1 or more is checked (S11). If YES in S11, the verify read of data "1" is performed (S12). If FR1 is at "L" level, or the variable IWT is smaller than W1, the verify read of data "1" is skipped. Note that if the verify read of data "2" is performed (S9), the verify read of data "1" is always performed (S12).

If all the outputs FR3, FR2, and FR1 from the data detector 9 are at "L" level, the programming ends (S13, S14, and S15). If even one of the outputs FR3, FR2, and FR1 from the data detector 9 is at "H" level, the flow returns to a write (S3). Every time the variable IWT is incremented by one, the write voltage applied to the selected word line (selected word line voltage between time t3 and t7 shown in FIG. 18) increases by 0.4V, and the threshold voltage of the memory cell M in which data "1", "2", are "3" are to be written rises by almost 0.4V. The predetermined W1, W2, and W3 are determined as follows.

How to determine W1, W2, and W3 is explained again with reference to FIG. 11. FIG. 11 shows an example of the write characteristics of the memory cell M. The abscissa represents the number of writes IWT, and the ordinate represents the threshold voltages of a memory cell (○) easy to write data and a memory cell (●) most difficult to write data in correspondence with the number of writes IWT. The threshold voltage of the memory cell easiest to write data reaches 0.1V after the first write. At this time, the threshold voltage of the memory cell most difficult to write data is -1.5V. Every time the number of writes increases by one, the write voltage of the selected word line increases by 0.4V, and thus the threshold voltage of the memory cell also increases by almost 0.4V. Note that the threshold voltage of the memory cell M connected to the data memory circuit 10 in which control data "1" is stored is lower by 0.8V.

Since the threshold voltages of all memory cells do not reach 0.4V after the first write, the verify read of data "3", "2", and "1" need not be performed. After the fourth write, the threshold voltage of the memory cell easiest to write data exceeds 1.2V, and the verify read of data "2" must be performed. The threshold voltage of the memory cell M connected to the data memory circuit 10 in which control data "1" is stored exceeds 0.4V, and thus the verify read of data "1" must be performed. Accordingly, W1 and W2 are determined as 4. After the sixth write, the threshold voltage of the memory cell easiest to write data exceeds 2.0V, and the verify read of data "3" must be performed. W3 is determined as 6.

After the ninth write, i.e., for IWT=9 or more, therefore, the outputs FR1 and FR2 from the data detector change to "L" level. After the 10th write, the threshold voltage of even the memory cell most difficult to write data exceeds 2.0V. For IWT=11 or more, the output FR3 from the data detector changes to "L" level.

Figure 23:
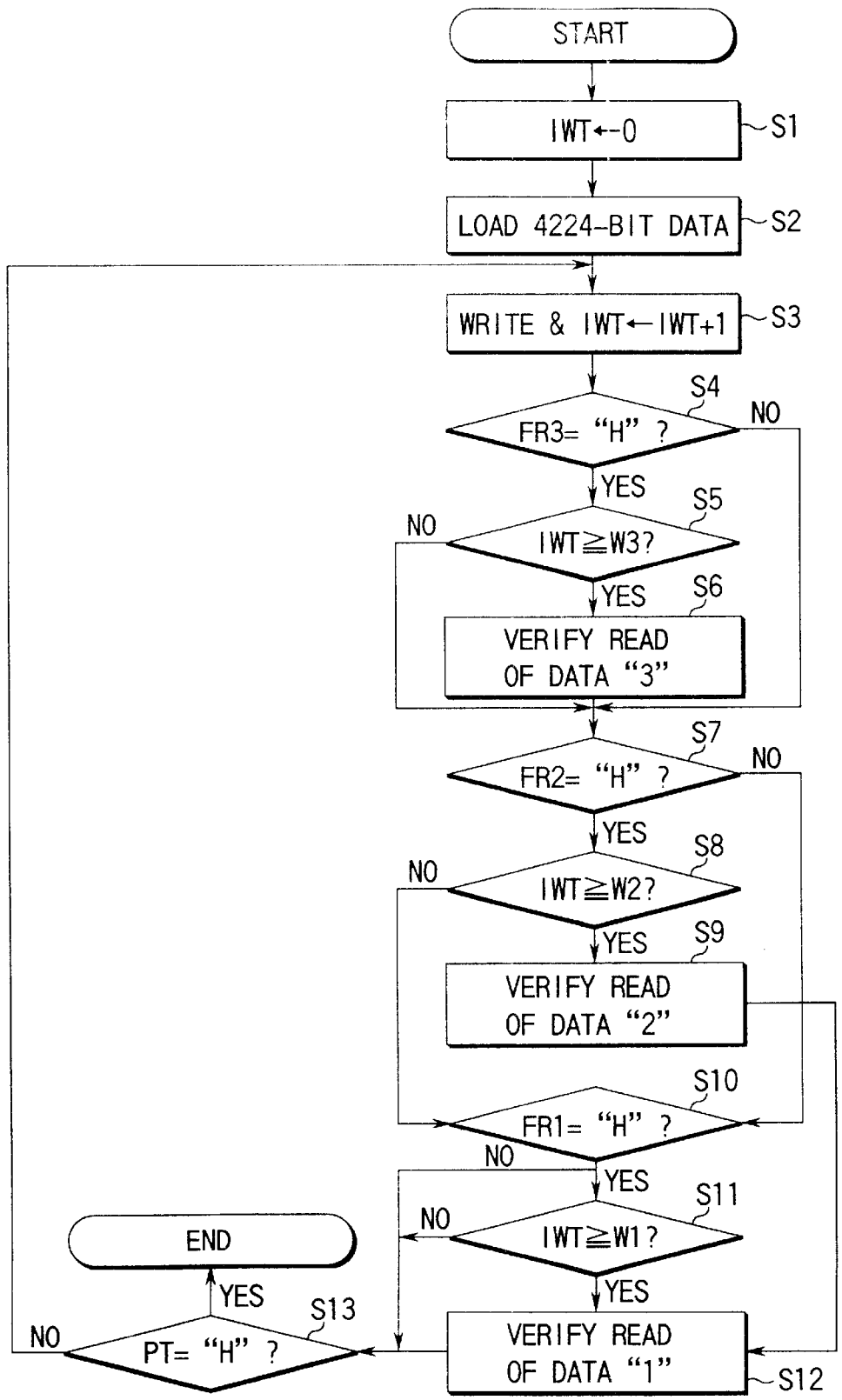
FIG. 23 is a flow chart showing detailed memory cell programming (data write) using the arrangements in FIGS. 14 and 12.

FIG. 23 is a flow chart showing memory cell programming using the data memory circuit in FIG. 14 and the data detector in FIG. 12. Steps S4, S7, and S10 are executed by changing the signals DEC3B, DEC2B, and DEC1B to "L" level and checking the signals FR3, FR2, and FR1. Step S13 is executed by changing the signal DECB to "L" level and checking the signal PT. The remaining steps are the same as in the flow shown in FIG. 10.

Figure 24:
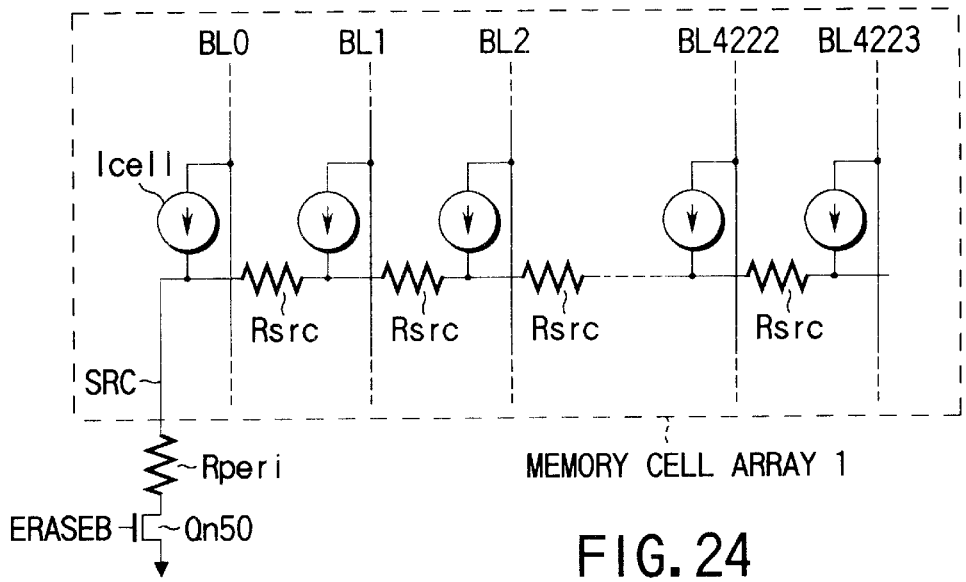
FIG. 24 is a circuit diagram showing an example of the parasitic resistance of the source line in FIG. 1.

FIG. 24 is a circuit diagram showing the parasitic resistance of the common source line SRC in the memory cell array 1. The common source line SRC is generally formed from the n-type diffusion layer 12 shown in FIG. 3. Rsrc represents the resistance of the n-type diffusion layer 12. Icell represents the cell current flowing through the memory cell M between the bit line BL and the common source line SRC. The common source line SRC is connected to, e.g., an aluminum interconnection having a relatively low resistance value at the terminal of the memory cell array 1, and to the control signal/control voltage generator 7 shown in FIG. 1 via, e.g., a polysilicon interconnection having a relatively high resistance value. Rperi represents the polysilicon interconnection resistance from the memory cell array 1 to the control signal/control voltage generator 7. The common source line SRC is grounded via an n-channel MOS transistor Qn50. In an erase, a signal ERASEB changes to "L" level to float the common source line SRC and increases to a high voltage along with an increase in voltage Vsub of p-type substrate on which the memory array 1 is formed. The voltage of the common source line SRC is greatly increased by the cell current Icell depending on the resistance Rperi and the n-channel MOS transistor Qn50. In FIG. 24, the cell current Icell flows from each bit line into the common source line SRC. However, the cell current Icell flows from only one of two bit lines in accordance with the bit line controller shown in FIG. 5 or 14.

The selected memory cell M flows or does not flow the cell current depending on the state of the memory cell M. If the threshold voltages of all selected memory cells M are higher than the word line voltage upon a read or write verify, no cell current Icell flows through the memory cells M. At this time, the common source line SRC is at 0V. If the threshold voltages of all selected memory cells M are lower than the word line voltage upon a read or write verify, the cell current Icell flows through 2,112 bit lines BL. At this time, a cell current Icell of 1 $\mu$A flows on average, and the voltage of the common source line SRC rises by about 0.2V for a parasitic resistance of 100 $\Omega$ mainly formed by the resistance Rperi and the n-channel MOS transistor Qn50.

For example, 1V is applied to the word line of a memory cell M which is connected to the bit line BL2 and has a threshold voltage of 0.9V, and whether the cell current Icell flows is detected. When the common source line SRC is at 0V, it is detected that the cell current flows and the memory cell M has a threshold voltage of 1V or less. When the common source line SRC is at 0.2V, it is detected that the memory cell M has a threshold voltage of 1V or more because of no cell current.

In the present invention, the read/verify voltage generator 7a is arranged to adjust, in accordance with the voltage of the common source line SRC, the voltage of the selected word line WL upon a read or write verify which is generated by the control signal/control voltage generator 7 shown in FIG. 1. That is, the read/verify voltage generator 7a generates, e.g., 1V when the common source line SRC is at 0V, and, e.g., 1.2V when the common source line SRC is at 0.2V. Therefore, the voltage difference between the source and gate of the memory cell M is kept at 1V, and the state of the memory cell M can be accurately detected. The read/verify voltage generator 7a preferably basically adjusts the voltage of the word line WL in accordance with the source voltage of the memory cell M.

As shown in FIG. 24, when the parasitic resistance is mainly formed from the resistance Rperi and the n-channel MOS transistor Qn50, the voltage of the common source line SRC is almost equal to the source voltage of the selected memory cell M. Even if these voltages are different from each other, the state of the memory cell M can be detected with high precision by adjusting the voltage of the selected word line WL in accordance with the voltage of the common source line SRC. The voltages of the non-selected word line WL and the selection gate line SG in the selected block are also adjusted in accordance with the voltage of the common source line SRC upon a read or write verify. This allows to detect the state of the selected memory cell M with higher precision.

Figure 25:
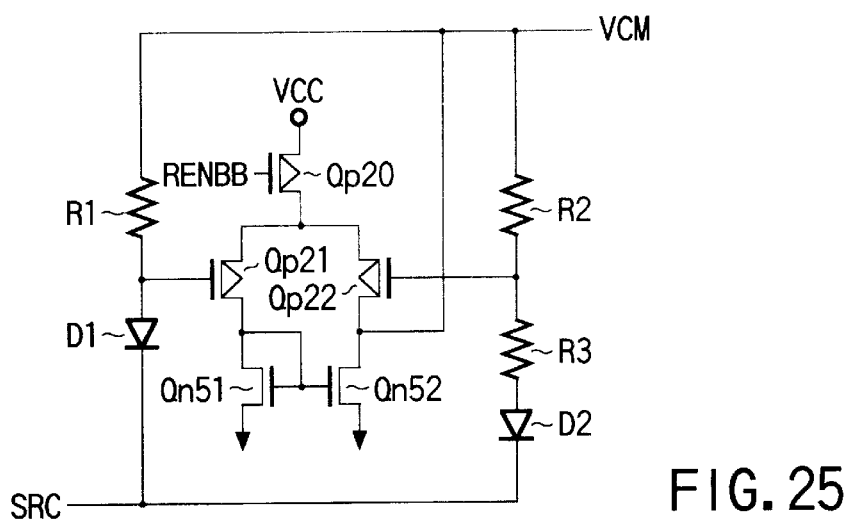
FIG. 25 is a circuit diagram showing the first circuit constituting a read/verify voltage generating circuit in FIG. 1.
Figure 26:
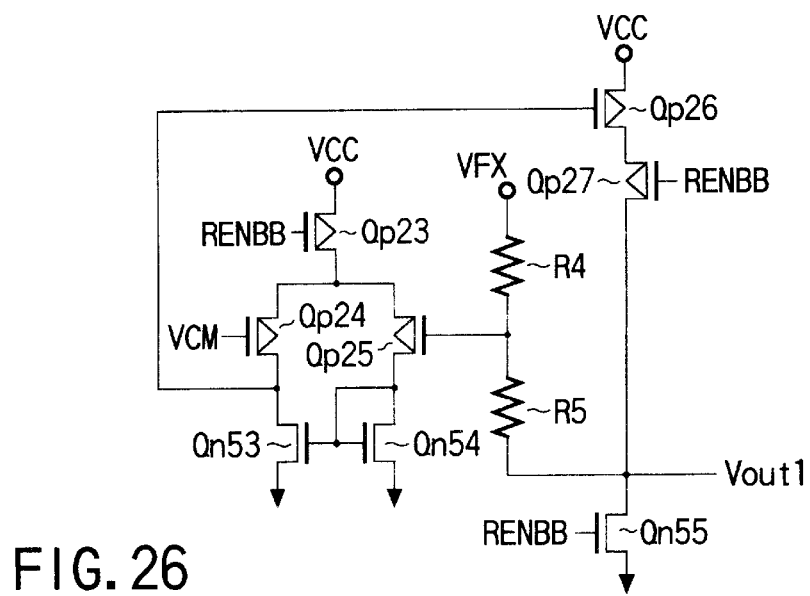
FIG. 26 is a circuit diagram showing the second circuit constituting the read/verify voltage generating circuit in FIG. 1.
Figure 27:
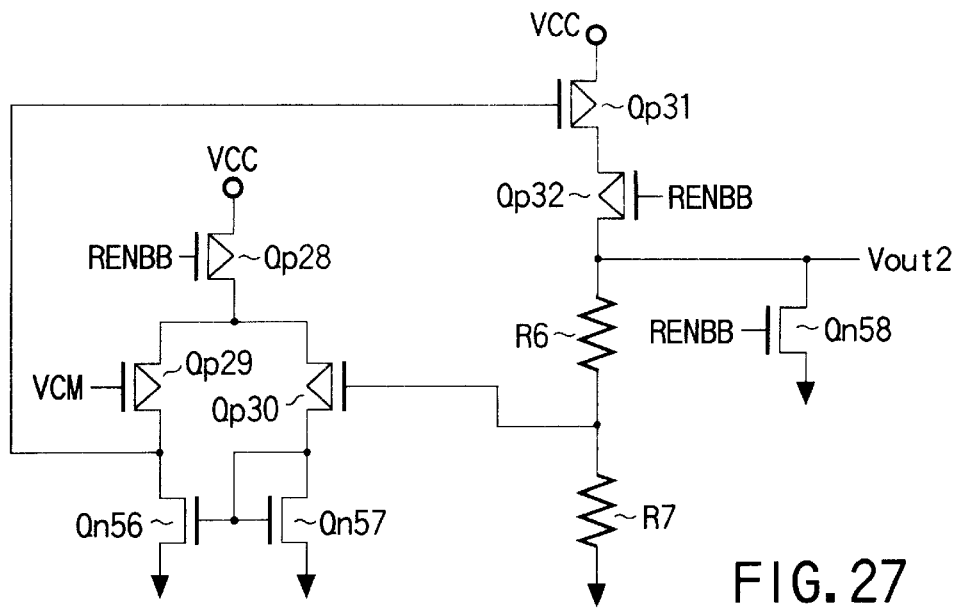
FIG. 27 is a circuit diagram showing the third circuit constituting the read/verify voltage generating circuit in FIG. 1.

FIGS. 25 to 27 are circuit diagrams, respectively, showing the internal arrangement of the read/verify voltage generator 7a and showing a circuit for generating the voltages of the word line WL and the selection gate line SG in the selected block upon a read or write verify.

FIG. 25 shows a reference voltage VCM generation circuit. This circuit is activated by an "L"-level signal RENBB. A comparator is constituted by p-channel MOS transistors Qp20, Qp21, and Qp22 and n-channel MOS transistors Qn51 and Qn52. The gate of Qp20 is controlled by the signal RENBB, and the source of Qp20 receives the power supply voltage VCC. The drain of Qp20 is connected to the sources of Qp21 and Qp22, and the drains of Qp21 and Qp22 are respectively connected to the drains of Qn51 and Qn52. The gates of both Qn51 and Qn52 are connected to the drain of Qp21, and their sources are grounded. The connection point between the drains of Qp22 and Qn52 serves as a VCM output node. The gate of Qp21 of the comparator is connected to the connection point between a resistance R1 and a diode D1 series-connected between the VCM output node and the common source line SRC. The gate of Qp22 of the comparator is connected to the connection point between resistances R2 and R3 series-connected to a diode D2 between the VCM output node and the common source line SRC.

The comparator, the resistances R1, R2, and R3, and the diodes D1 and D2 constitute a bandgap reference circuit to obtain, as a voltage VCM, an output voltage which depends on only the voltage of the common source line SRC. When the common source line SRC is at 0V, e.g., VCM=1.2V can be obtained. When the common source line SRC is at 0.2V, VCM=1.4V can be obtained. This voltage VCM is applied to the selected word line WL2 via the read/verify voltage generator 7a of the control signal/control voltage generator 7 and the word line controller 6 during times t8 and t9 in FIG. 9 or times t12 and t13 in FIG. 20.

FIG. 26 shows a circuit for generating a voltage Vout1 lower than the reference voltage VCM. This circuit is activated when signal RENBB is "L"-level. A comparator is constituted by p-channel MOS transistors Qp23, Qp24, and Qp25 and n-channel MOS transistors Qn53 and Qn54. The gate of Qp23 is controlled by the signal RENBB, and the source of Qp23 receives the power supply voltage VCC. The drain of Qp23 is connected to the sources of Qp24 and Qp25, and the drains of Qp24 and Qp25 are connected to the drains of Qn53 and Qn54, respectively. The gates of both Qn53 and Qn54 are connected to the drain of Qp25, and their sources are grounded. The gate of Qp24 receives the reference voltage VCM from the circuit shown in FIG. 25. The gate of Qp25 is connected to the other terminal of a resistance R4 having one terminal receiving a voltage VFX. The other terminal of the resistance R4 is also connected to one terminal of a resistance R5. The other terminal of the resistance R5 is connected to the drain of an n-channel MOS transistor Qn55 having a gate controlled by the signal RENBB and a source grounded, and also connected to the output Vout1. A p-channel MOS transistor Qp26 having a source connected to the power supply voltage VCC and a gate connected to the drain of Qp24 is series-connected to a p-channel MOS transistor Qp27 having a gate controlled by the signal RENBB and a drain connected to the output Vout1.

Two circuits each shown in FIG. 26 are arranged to respectively generate 0.4V and 1.0V when the common source line SRC is at 0V. These voltages are transferred to the word line WL2 via the read/verify voltage generating circuit 7a of the control signal/control voltage generating circuit 7 and the word line controlling circuit 6 as the voltage of the selected word line WL2 during times t12 and t13 in FIG. 9 or times t22 and t23 in FIG. 21, and as the voltage of the selected word line WL2 during times t8 and t9 in FIG. 7 or times t18 and t19 in FIG. 17.

More specifically, the voltage VFX is a low voltage of, e.g., 2.8V. For R4:R5=2:1, the output voltage Vout1 is 0.4V when the common source line SRC is at 0V, and 0.7V when the common source line SRC is at 0.2V. For R4:R5=8:1, the output voltage Vout1 is 1.0V when the common source line SRC is at 0V, and 1.225V when the common source line SRC is at 0.2V.

FIG. 27 shows a circuit for generating a voltage Vout2 higher than the reference voltage VCM. This circuit is activated when signal RENBB is at "L"-level. A comparator is constituted by p-channel MOS transistors Qp28, Qp29, and Qp30 and n-channel MOS transistors Qn56 and Qn57. The gate of Qp28 is controlled by the signal RENBB, and the source of Qp28 receives the power supply voltage VCC. The drain of Qp28 is connected to the sources of Qp29 and Qp30, and the drains of Qp29 and Qp30 are connected to the drains of Qn56 and Qn57, respectively. The gates of both Qn56 and Qn57 are connected to the drain of Qp30, and their sources are grounded. The gate of Qp29 receives the reference voltage VCM from the circuit shown in FIG. 25. The connection point between the drains of Qp29 and Qn56 is connected to the gate of a p-channel MOS transistor Qp31. The source of Qp31 is connected to the power supply voltage VCC, and the drain of Qp31 is connected to the source of a p-channel MOS transistor Qp32. The gate of Qp32 is controlled by the signal RENBB. The drain of Qp32 is connected to the output Vout2 and grounded via resistances R6 and R7. The connection point between the resistances R6 and R7 is connected to the gate of Qp30. The drain and source of an n-channel MOS transistor Qn58 having a gate controlled by the signal RENBB are respectively connected to the node of the output terminal Vout2 and ground.

Three circuits each shown in FIG. 27 are arranged to respectively generate 1.8V, 2.0V, and 3.0V when the common source line SRC is at 0V. These voltages are transferred to the word line WL and the selection gate SG in the selected block by the control signal/control voltage generating circuit 7 and the word line controlling circuit 6 as the voltage of the selected word line WL2 during times t4 and t5 in FIG. 7 or times t2 and t3 in FIG. 16, as the voltage of the selected word line WL2 during times t4 and t5 in FIG. 9 or times t2 and t3 in FIG. 19, and as the voltage for the non-selected word line WL and the selection gate SG in the selected block upon a read or write verify.

For example, for R6:R7=1:2, the output voltage Vout2 is 1.8V when the common source line SRC is at 0V, and 2.1V when the common source line SRC is at 0.2V. For R6:R7=2:3, the output voltage Vout2 is 2.0V when the common source line SRC is at 0V, and 2.33V when the common source line SRC is at 0.2V. For R6:R7=3:2, the output voltage Vout2 is 3.0V when the common source line SRC is at 0V, and 3.5V when the common source line SRC is at 0.2V.

That is, the reference voltage VCM and the output voltages Vout1 and Vout2 are generated in accordance with the voltage of the common source line, and applied from the read/verify voltage generating circuit to the selected word line WL2, the non-selected word lines 1, 3, and 4, and the selection gate SG via the word line controlling circuit, as shown in FIG. 1.

More specifically, with reference to FIGS. 1 to 4, a semiconductor memory device according to the present invention is characterized by comprising a memory cell (M) having a gate (16), a drain (12), and a source (12), a controlling circuit (6) for applying a read gate voltage to the gate in order to detect the state of the memory cell, and a circuit (7a) for adjusting and generating the read gate voltage in accordance with the voltage of the source.

In addition to the above features, the semiconductor memory device is characterized by further comprising a transistor (M or S) which is series-connected to the memory cell and has another gate (16 or 18), a controlling circuit (6) serving as means for applying a control voltage to this another gate electrode, and a circuit (7a) for adjusting and generating the control voltage in accordance with the voltage of the source.

This arrangement is also characterized by series-connecting a plurality of memory cells and connecting one terminal of the series-connected structure to a bit line (BL) and the other terminal to a source line (SRC). It is preferably to use the source line (SRC) as a common source line for a plurality of memory cells, and to adjust and generate the read gate voltage in accordance with the voltage of the common source line.

With the above arrangement, in the semiconductor memory device according to the present invention, the read voltage applied to the control gate upon a read or write verify after a write is adjusted in accordance with the source voltage of the memory cell. Alternatively, the read voltage is adjusted in accordance with the voltage of the source line common to a plurality of memory cells. Consequently, a semiconductor memory device capable of detecting the memory cell state with high precision regardless of the source voltage of the memory cell can be realized.

The present invention is not limited to the above-described embodiment. For example, the present invention is not limited to a NAND memory cell array described in the embodiment of the present invention, and may be similarly applied to a nonvolatile semiconductor memory device having a NOR, DINOR, or AND memory cell array, and to a hot electron injection write nonvolatile semiconductor memory device.

Figure 28:
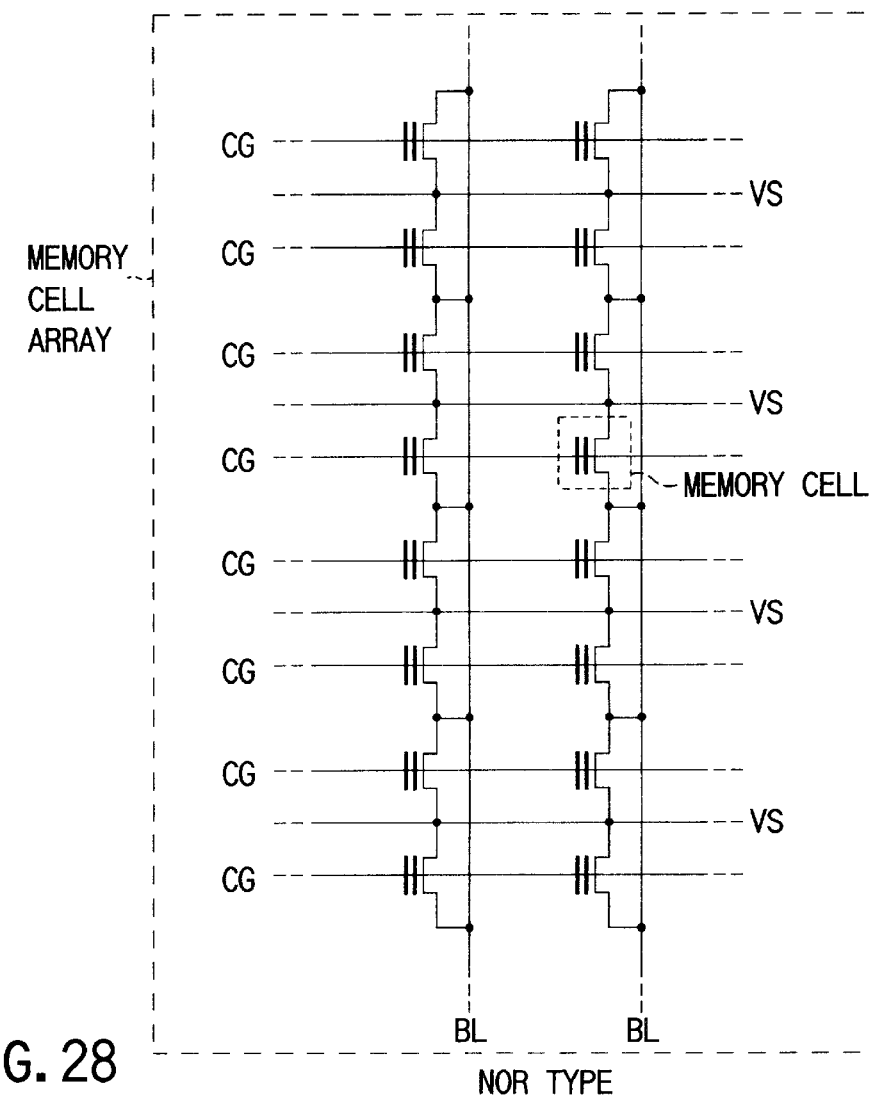
FIG. 28 is a circuit diagram showing the arrangement of a NOR EEPROM to which an embodiment of the present invention can be applied.

FIG. 28 is a circuit diagram showing a NOR EEPROM memory cell array. As shown in FIG. 28, in the NOR EEPROM, each memory cell is formed between a bit line BL and a source line VS extending in a direction perpendicular to the bit line BL, and the drain and source of the memory cell are connected thereto. A control gate CG of each memory cell is connected to a transistor (not shown) of a peripheral circuit for controlling a memory cell control voltage. The present invention can also be applied to this memory cell array arrangement, and the CG voltage is adjusted in accordance with variations in voltage of the source line VS.

Figure 29:
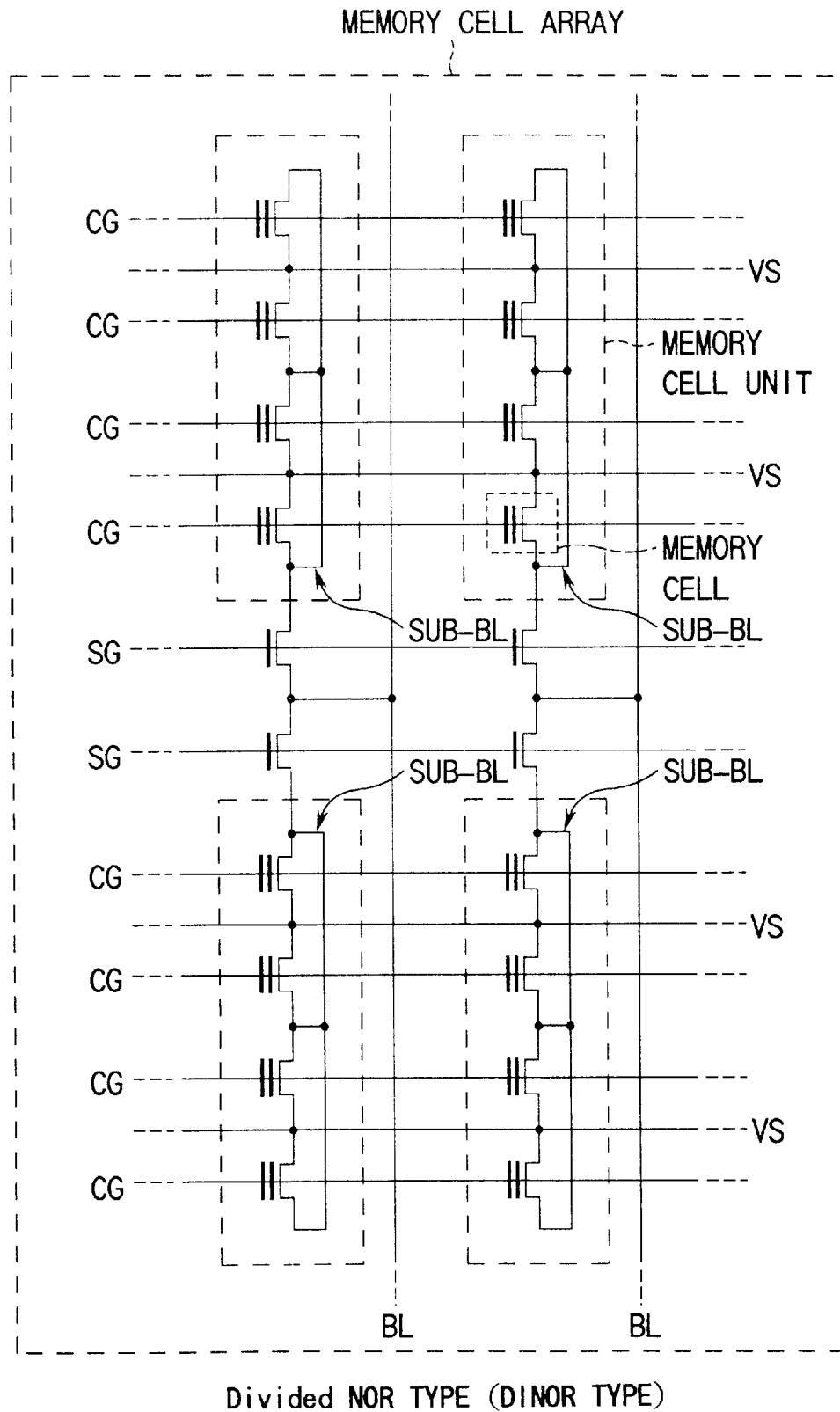
FIG. 29 is a circuit diagram showing the arrangement of a DINOR EEPROM to which an embodiment of the present invention can be applied.

FIG. 29 is a circuit diagram showing a DINOR (Divided NOR) EEPROM memory cell array. As shown in FIG. 29, in the DINOR EEPROM, memory cells are connected parallel between one sub-bit line (sub-BL) and a plurality of source lines VS. The sub-bit line (sub-BL) is connected to a bit line BL via a bit line selection gate (SG). The selection gate SG of each selection transistor and a control gate CG of each memory cell are respectively connected to transistors (not shown) of a peripheral circuit for controlling a memory cell control voltage. The present invention may also be applied to this memory cell array arrangement, and the CG and SG voltages are adjusted in accordance with variations in voltage of the source line VS.

Figure 30:
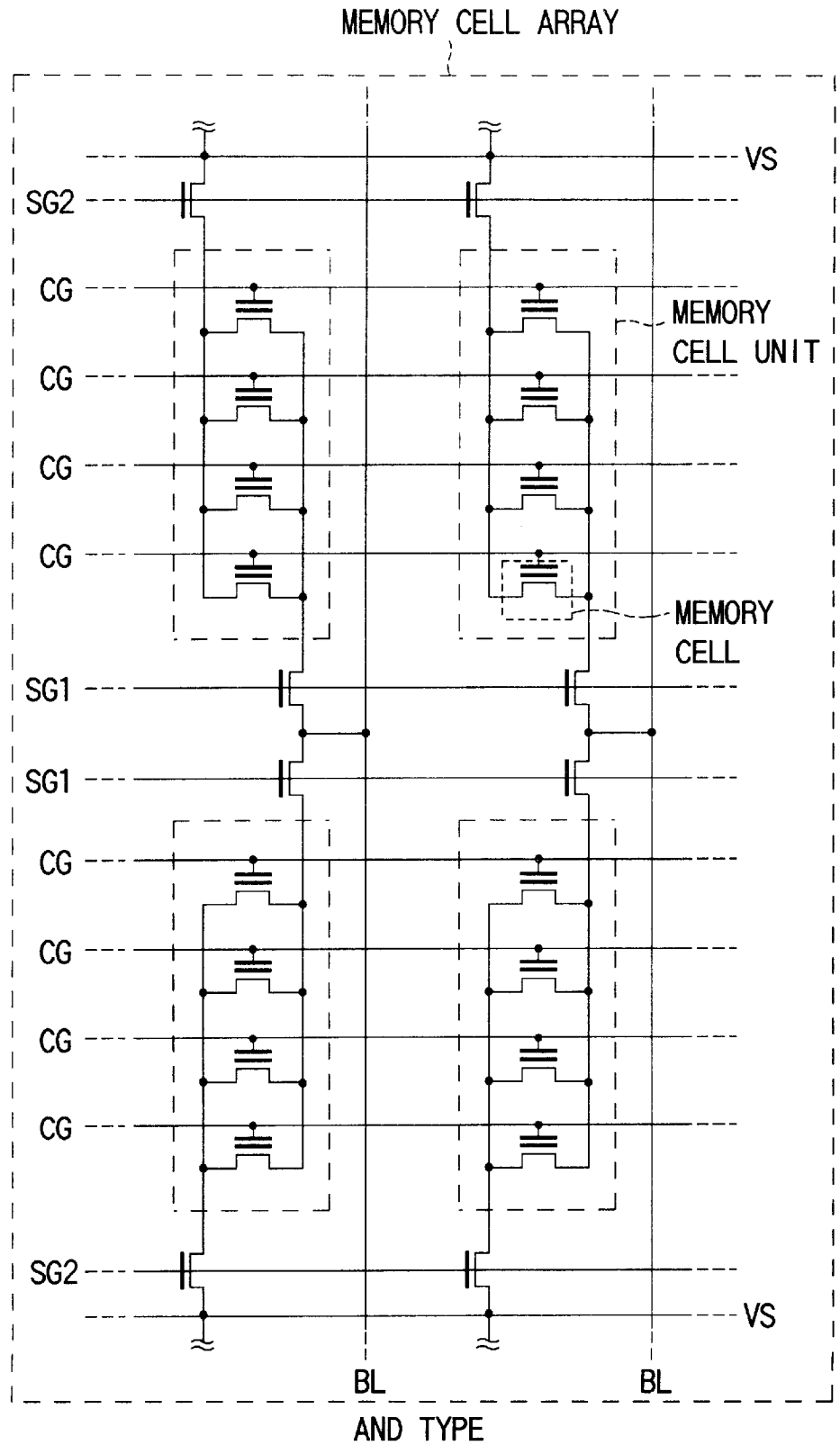
FIG. 30 is a circuit diagram showing the arrangement of an AND EEPROM to which an embodiment of the present invention can be applied.

FIG. 30 is a circuit diagram showing an AND EEPROM memory cell array. As shown in FIG. 30, in the AND EEPROM, a bit line side selection gate (SG1), a group of memory cells parallel connected to each other (memory cell unit), and a source line side selection gate (SG2) are series-connected between a bit line BL and a source line VS. The selection gates SG1 and SG2 of each selection transistor and a control gate CG of each memory cell are respectively connected to transistors (not shown) of a peripheral circuit for controlling selection transistor and memory cell control voltages. The present invention can also be applied to this memory cell array arrangement, and the CG, SG1, and SG2 voltages are adjusted in accordance with variations in voltage of the source line VS.

The read/verify voltage generator 7a shown in FIGS. 25 to 27 can be variously modified within the spirit and scope of the present invention. The present invention is not limited to the multi-valued memory, and is applicable to a memory device in which the memory cell state must be detected with high precision.

As has been described above, according to the present invention, the read voltage applied to the control gate upon a read or write verify after a write is adjusted in accordance with the source voltage of the memory cell. Alternatively, the read voltage is adjusted in accordance with the voltage of the source line common to a plurality of memory cells. As a result, a semiconductor memory device capable of detecting the memory cell state with high precision regardless of the source voltage of the memory cell can be realized.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
   at least one memory cell having a gate, a drain, and a source;
   a control voltage generating circuit for generating a read gate voltage adjusted in accordance with change of a voltage of the source; and a controlling circuit for applying the read gate voltage to the gate in order to detect a state of said memory cell.

2. A device according to claim 1, wherein a plurality of said memory cells are connected in series, and one and the other terminals of the memory cells connected in series are electrically connected to a bit line and a source line, respectively.

3. A device according to claim 1, wherein said memory cell has a charge storage layer, and is set in a predetermined data storage state by electrically controlling a charge amount in the charge storage layer to change a threshold voltage of said memory cell.

4. A semiconductor memory device comprising:
   at least one memory cell having a first gate, a first drain, and a first source;
   a transistor connected in series to said memory cell and having a second gate, a second drain, and a second source;
   a control voltage generating circuit for generating first and second voltages adjusted in accordance with change of a voltage of the first source; and
   a controlling circuit for applying the first voltage to the first gate and the second voltage to the second gate in order to detect a state of said memory cell.

5. A device according to claim 4, wherein a plurality of said memory cells are connected in series, and one and the other terminals of the memory cells connected in series are electrically connected to a bit line and a source line, respectively.

6. A device according to claim 4, wherein said memory cell has a charge storage layer, and is set in a predetermined data storage state by electrically controlling a charge amount in the charge storage layer to change a threshold voltage of the memory cell.

7. A semiconductor memory device comprising:
   a memory cell having a gate electrode, a drain region, and a source region;
   a source line electrically connected to the source region;
   a first circuit for generating a read gate voltage adjusted in accordance with change of a voltage of said source line; and
   a second circuit for applying the read gate voltage to the gate electrode in order to detect a state of said memory cell.

8. A device according to claim 7, further comprising:
   a transistor connected in series to said memory cell and having another gate electrode;
   a third circuit for generating a control voltage adjusted in accordance with the voltage of said source line; and
   a fourth circuit for applying the control voltage to said another gate electrode.

9. A device according to claim 8, wherein said transistor has substantially the same structure as said memory cell.

10. A semiconductor memory device comprising:
    a plurality of memory cells each having a gate, a drain, and a source;
    a common source line electrically connected to the sources of said plurality of memory cells;
    a word line electrically connected to the gates of said plurality of memory cells;
    a first circuit for generating a read voltage adjusted in accordance with change of a voltage of said common source line; and
    a second circuit for applying the read voltage to said word line in order to detect states of said memory cells.

11. A device according to claim 10, further comprising:
    a plurality of transistors each connected to a corresponding one of said memory cells in series and having another gate electrode;
    a common gate line electrically connected to said another gate electrodes of said plurality of transistors;
    a third circuit for generating a control voltage adjusted in accordance with the voltage of said common source line; and
    a fourth circuit for applying the control voltage to said common gate line.

12. A device according to claim 11, wherein said transistors have substantially the same structure as said memory cells.

13. A semiconductor memory device comprising:
    a memory cell having a first gate electrode, a first drain region, and a first source region, and being set in a predetermined data storage state by changing electrical characteristic thereof;
    a source line electrically connected to the first source region;
    a first circuit for changing the electrical characteristic of said memory cell;
    a second circuit for generating a read voltage and a verify voltage adjusted in accordance with change of a voltage of said source line;
    a third circuit for applying the read voltage to the first gate electrode in order to read out data from said memory cell; and
    a fourth circuit for applying the verify voltage to the first gate electrode in order to detect the electrical characteristic of said memory cell.

14. A device according to claim 13, wherein said memory cell is set in one of three or more different data storage states, and said second circuit generates two or more different read voltages and two or more different verify voltages in accordance with the data storage states.

15. A device according to claim 14, wherein said two or more different read voltages and said two or more different verify voltages include a reference voltage generated in accordance with the voltage of the source line, one or more voltages lower than the reference voltage, and one or more voltages higher than the reference voltage, those voltages selectively being applied to said first gate electrode.

16. A device according to claim 13, further comprising:
    a transistor connected to said memory cell in series and having a second gate electrode, a second drain region, and a second source region;
    a fifth circuit for generating a control voltage adjusted in accordance with the voltage of said source line; and
    a sixth circuit for applying the control voltage to the second gate electrode.

17. A device according to claim 16, wherein said transistor has substantially the same structure as said memory cell.

18. A semiconductor memory device comprising:
    a plurality of memory cells each having a first gate electrode, a first drain region, and a first source region, and being set in a predetermined data storage state by changing electrical characteristic thereof;
    a common source line electrically connected to the first source regions of said plurality of memory cells;
    a word line electrically connected to the first gate electrodes of said plurality of memory cells;
    a first circuit for changing the electrical characteristic of said plurality of memory cells;

a second circuit for generating a read voltage and a verify voltage adjusted in accordance with change of a voltage of said common source line;

a third circuit for applying the read voltage to said word line in order to read out data from said plurality of memory cells; and a fourth circuit for applying the verify voltage to said word line in order to detect the electrical characteristic of said plurality of memory cells.

19. A device according to claim 18, wherein said memory cells are set in one of three or more different data storage states, and said second circuit generates two or more different read voltages and two or more different verify voltages in accordance with the data storage states.

20. A device according to claim 19, wherein said two or more different read voltages and said two or more different verify voltages include a reference voltage generated in accordance with the voltage of the common source line, one or more voltages lower than the reference voltage, and one or more voltages higher than the reference voltage, those voltages selectively being applied to said word line.

21. A device according to claim 18, further comprising:

a plurality of transistors each connected to a corresponding one of said memory cells in series and having a second gate electrode, a second drain region, and a second source region;

a common gate line electrically connected to the second gate electrodes of said plurality of transistors;

a fifth circuit for generating a control voltage adjusted in accordance with the voltage of said common source line; and a sixth circuit for applying the control voltage to said common gate line.

22. A device according to claim 21, wherein said transistors have substantially the same structure as said memory cells.

23. A semiconductor memory device comprising:

a memory cell having a gate electrode, a drain electrode and a source electrode;

a word line connected to said gate electrode;

a bit line connected to said drain electrode;

a source line connected to said source electrode;

a voltage generator generating a read voltage and a verify voltage which are adjusted in accordance with change of a voltage of said source line; and a control circuit reading out data stored in said memory cell and verifying whether or not the memory cell has been programmed, by applying said verify voltage to said word line.

24. The device according to claim 23, wherein said memory cell stores multi-level data, and said voltage generator generates a plurality of levels of read voltage to detect what level of data is stored in the memory cell, and generates a plurality of levels of verify voltage to detect whether the memory cell has reached a designated program state.

25. A semiconductor memory device comprising:

a memory cell unit including a memory cell and a transistor connected to said memory cell in series, said memory cell having a first gate electrode and said transistor having a second gate electrode;

a word line connected to said first gate electrode;

a control line connected to said second gate electrode;

a bit line connected to one terminal of said memory unit;

a source line connected to another terminal of said memory unit;

a voltage generator generating a read voltage, a verify voltage, and a control voltage which are adjusted in accordance with change of a voltage of said source line; and a control circuit reading out data stored in said memory cell by applying said read voltage to said word line while applying said control voltage to said control line; programming data into said memory cell; and verifying whether the memory cell has been programmed, by applying said verify voltage to said word line while applying said control voltage to said control line.

26. The device according to claim 25, wherein:

said memory cell stores multi-level data, and said voltage generator generates a plurality of levels of read voltage to detect what level of data is stored in the memory cell, and generates a plurality of levels of verify voltage to detect whether the memory cell has reached a designated program state.

27. The device according to claim 25, wherein said transistor has the same structure as said memory cell.

28. A semiconductor memory device comprising:

a plurality of memory cells, each having a gate electrode, a drain electrode, and a source electrode;

a common word line connected to said memory cells in common at each gate electrode;

a plurality of bit lines connected to said memory cells at each drain electrode, respectively;

a common source line connected to said memory cells in common at each source electrode;

a voltage generator generating a read voltage and verify voltage which are adjusted in accordance with change of a voltage of said common source line; and a control circuit simultaneously reading out data stored in said memory cells by applying said read voltage to said common word line; simultaneously programming data into said memory cells; and simultaneously verifying whether each memory cell has been programmed, by applying said verify voltage to said common word line.

29. The device according to claim 28, wherein:

each of said memory cells stores multi-level data, and said voltage generator generates a plurality of levels of read voltage to detect what level of data is stored in the memory cell, and generates a plurality of levels of verify voltage to detect whether the memory cell has reached a designated program state.

30. A semiconductor memory device comprising:

a plurality of memory cell units, each including a memory cell and a transistor connected to said memory cell in series, said memory cell having a first gate electrode and said transistor having a second gate electrode;

a common word line connected to said memory cell units in common at each first gate electrode;

a common control line connected to said memory cell units in common at each second gate electrode;

a plurality of bit lines connected to said memory cell units at one terminal of each memory cell unit, respectively;

a common source line connected to said memory cell units in common at another terminal of each memory cell unit;

a voltage generator generating a read voltage, a verify voltage, and a control voltage which are adjusted in accordance with change of a voltage of said common source line; and a control circuit simultaneously reading out data stored in said memory cells by applying said read voltage to said common word line while applying said control voltage to said common control line; simultaneously programming data into said memory cells; and verifying whether each memory cell has been programmed, by applying said verify voltage to said common word line while applying said control voltage to said common control line.

31. The device according to claim 30, wherein:

each of said memory cells stores multi-level data, and said voltage generator generates a plurality of levels of read voltage to detect what level of data is stored in the memory cell, and generates a plurality of levels of verify voltage to detect whether the memory cell has reached a designated program state.

32. The device according to claim 30 wherein said transistor has the same structure as said memory cell.

\* \* \* \* \*